US009508957B2

(12) United States Patent
Forrest et al.

(10) Patent No.: US 9,508,957 B2
(45) Date of Patent: Nov. 29, 2016

(54) OLED WITH IMPROVED LIGHT OUTCOUPLING

(75) Inventors: Stephen Forrest, Ann Arbor, MI (US); Yiru Sun, Forrest Hills, NY (US)

(73) Assignee: The Regents of the University of Michigan, Ann Arbor, MI (US)

( * ) Notice: Subject to any disclaimer, the term of this patent is extended or adjusted under 35 U.S.C. 154(b) by 236 days.

(21) Appl. No.: 12/531,595

(22) PCT Filed: Mar. 31, 2008

(86) PCT No.: PCT/US2008/004242
§ 371 (c)(1),
(2), (4) Date: Mar. 23, 2010

(87) PCT Pub. No.: WO2008/121414
PCT Pub. Date: Oct. 9, 2008

(65) Prior Publication Data
US 2010/0181899 A1 Jul. 22, 2010

Related U.S. Application Data

(63) Continuation-in-part of application No. 11/729,877, filed on Mar. 30, 2007, now abandoned, and a continuation-in-part of application No. 12/059,783, filed on Mar. 31, 2008, now abandoned.

(60) Provisional application No. 61/070,329, filed on Mar. 21, 2008.

(51) Int. Cl.
H05B 33/14 (2006.01)
H01L 51/52 (2006.01)
H01L 51/50 (2006.01)

(52) U.S. Cl.
CPC ....... *H01L 51/5275* (2013.01); *H01L 51/5012* (2013.01)

(58) Field of Classification Search
CPC .......... H01L 51/5262; H01L 51/5275; H01L 51/5278
USPC ........................................ 313/500
See application file for complete search history.

(56) References Cited

U.S. PATENT DOCUMENTS 5,891,554 A 4/1999 Hosokawa et al.
6,704,335 B1 * 3/2004 Koyama et al. .......... 372/43.01
(Continued)

FOREIGN PATENT DOCUMENTS

| CN | 1638585 | 7/2005 |
| JP | 2001-202827 | 7/2001 |
| JP | 2002-091344 | 3/2002 |

OTHER PUBLICATIONS

J.-Q. Xi et al., "Optical thin-film materials with low refractive index for broadband elimination of Fresnel reflection," Nature Photonics, Mar. 2007, vol. 1, p. 176-79.

(Continued)

*Primary Examiner* — Andrew Coughlin
(74) *Attorney, Agent, or Firm* — Riverside Law LLP

(57) ABSTRACT

An OLED may include regions of a material having a refractive index less than that of the substrate, or of the organic region, allowing for emitted light in a waveguide mode to be extracted into air. These regions can be placed adjacent to the emissive regions of an OLED in a direction parallel to the electrodes. The substrate may also be given a nonstandard shape to further improve the conversion of waveguide mode and/or glass mode light to air mode. The outcoupling efficiency of such a device may be up to two to three times the efficiency of a standard OLED. Methods for fabricating such a transparent or top-emitting OLED is also provided.

12 Claims, 25 Drawing Sheets

(56) References Cited

U.S. PATENT DOCUMENTS

| | | |
|---|---|---|
| 6,727,646 B1 | 4/2004 | Koyama et al. |
| 7,053,547 B2 | 5/2006 | Lu et al. |
| 7,714,328 B2 | 5/2010 | Miyazawa |
| 7,722,965 B2 | 5/2010 | Juni et al. |
| 2002/0081453 A1 | 6/2002 | Hamada et al. |
| 2003/0117067 A1* | 6/2003 | Roitman et al. ............ 313/504 |
| 2004/0004594 A1* | 1/2004 | Kato et al. .................. 345/87 |
| 2004/0007969 A1 | 1/2004 | Lu et al. |
| 2004/0070335 A1* | 4/2004 | Cok ............................ 313/506 |
| 2004/0104672 A1 | 6/2004 | Shiang et al. |
| 2004/0160165 A1 | 8/2004 | Yamauchi |
| 2004/0188690 A1* | 9/2004 | Noguchi ..................... 257/79 |
| 2004/0189185 A1 | 9/2004 | Yotsuya |
| 2005/0142379 A1 | 6/2005 | Juni et al. |
| 2006/0007552 A1 | 1/2006 | Takakuwa et al. |
| 2006/0071233 A1 | 4/2006 | Cho et al. |
| 2006/0186801 A1 | 8/2006 | West |
| 2006/0290274 A1* | 12/2006 | Oota ........................... 313/506 |
| 2007/0222372 A1 | 9/2007 | Cok et al. |

OTHER PUBLICATIONS

Tetsuo Tsutsui et al., "Doubling Coupling-Out Efficiency in Organic Light-Emitting Devices Using a Thin Silica Aerogel Layer," Advanced Materials, Aug. 3, 2001, vol. 13, No. 15, p. 1149-52.

PCT International Search Report and Written Opinion for PCT/US2008/004242, mailed on Aug. 27, 2008.

European Search Report for European Patent Application No. 12000004.7, mailed on Feb. 14, 2012.

* cited by examiner

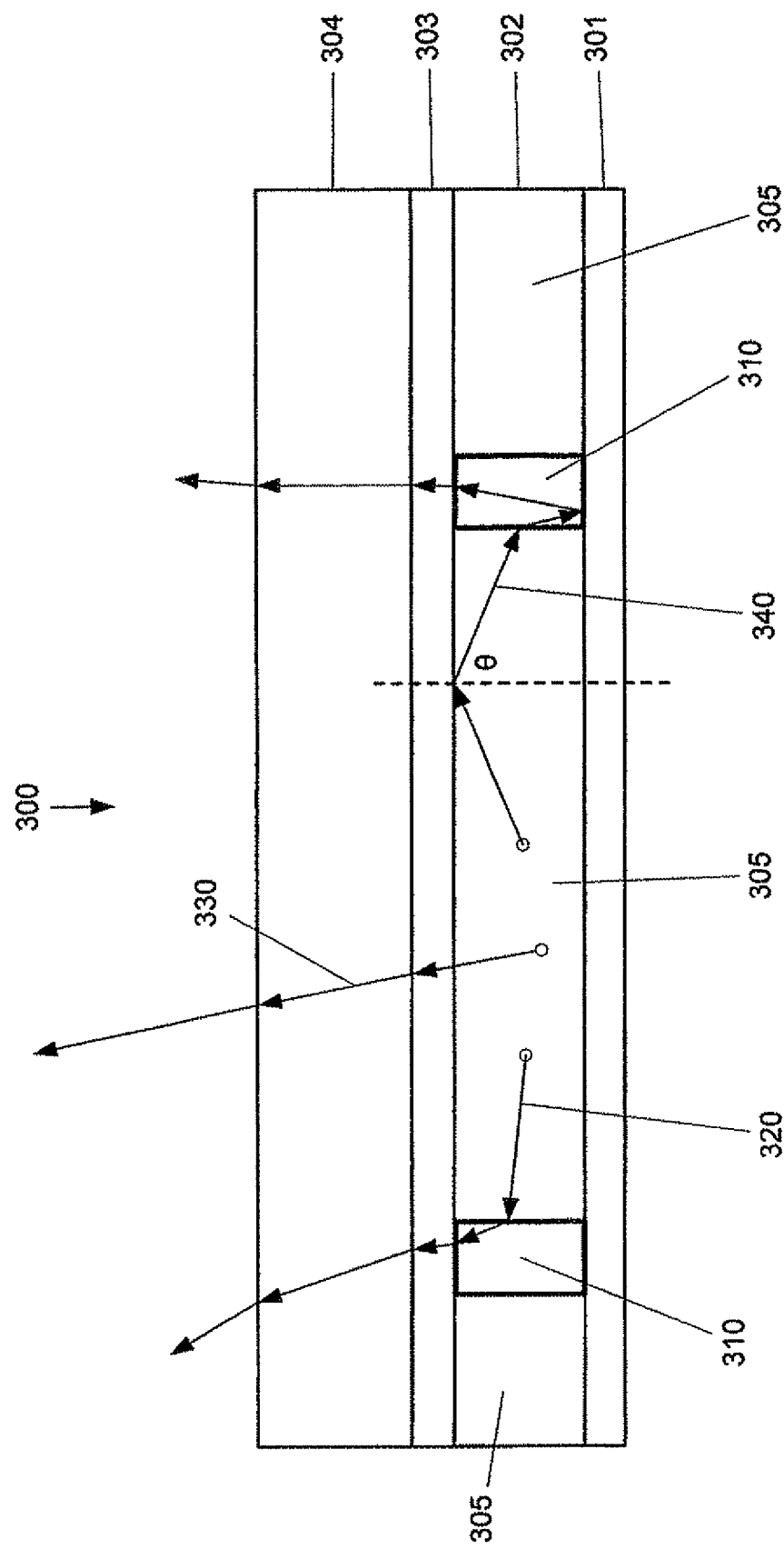

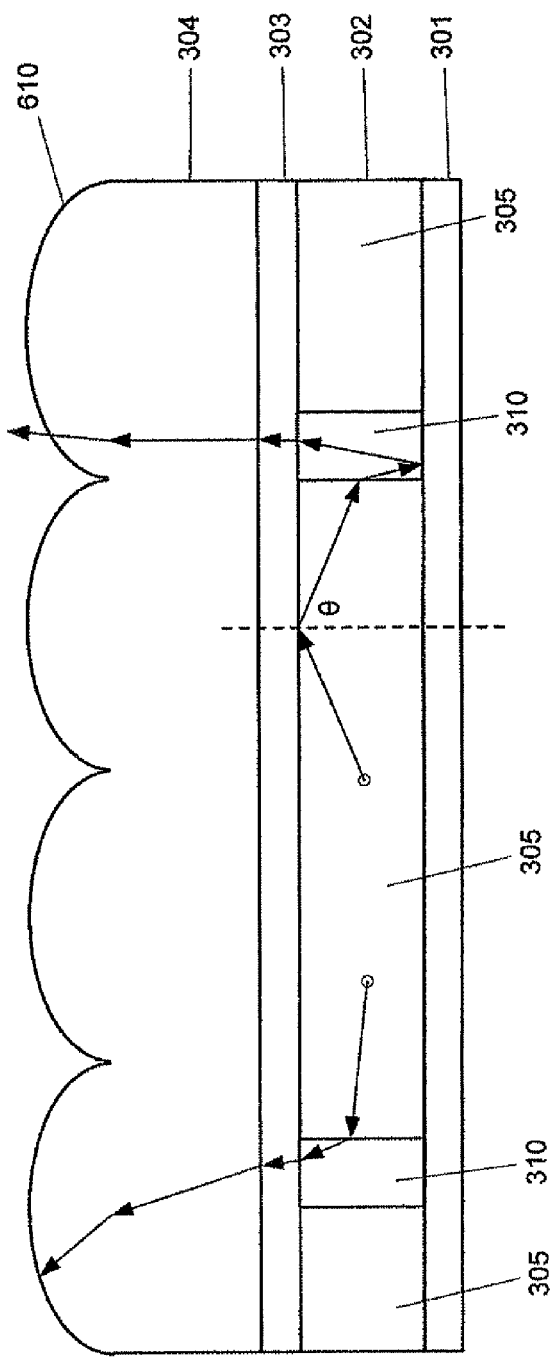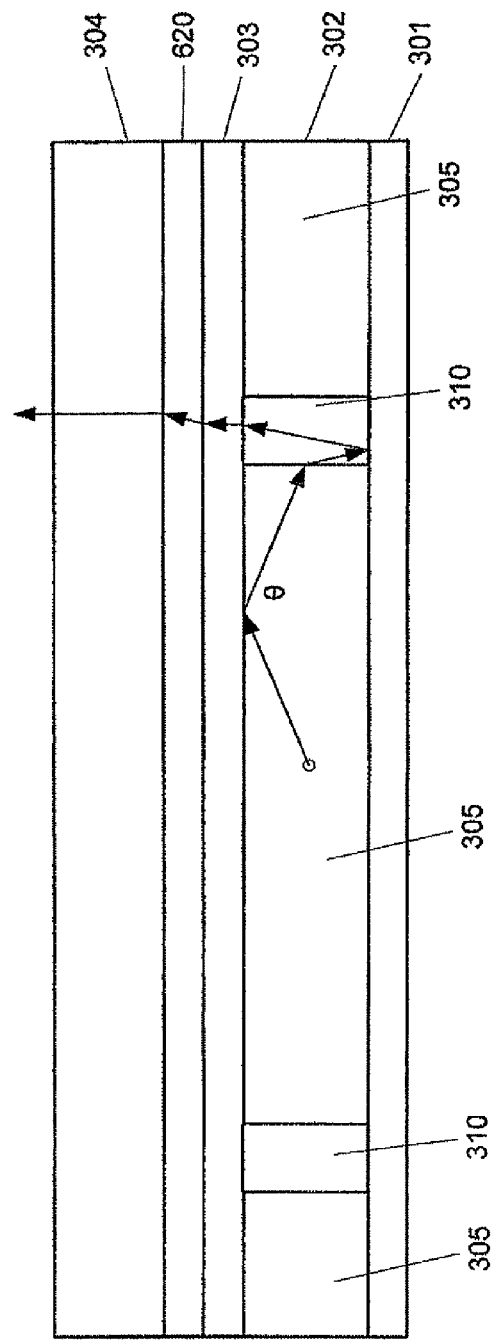
FIG. 6A
FIG. 6B

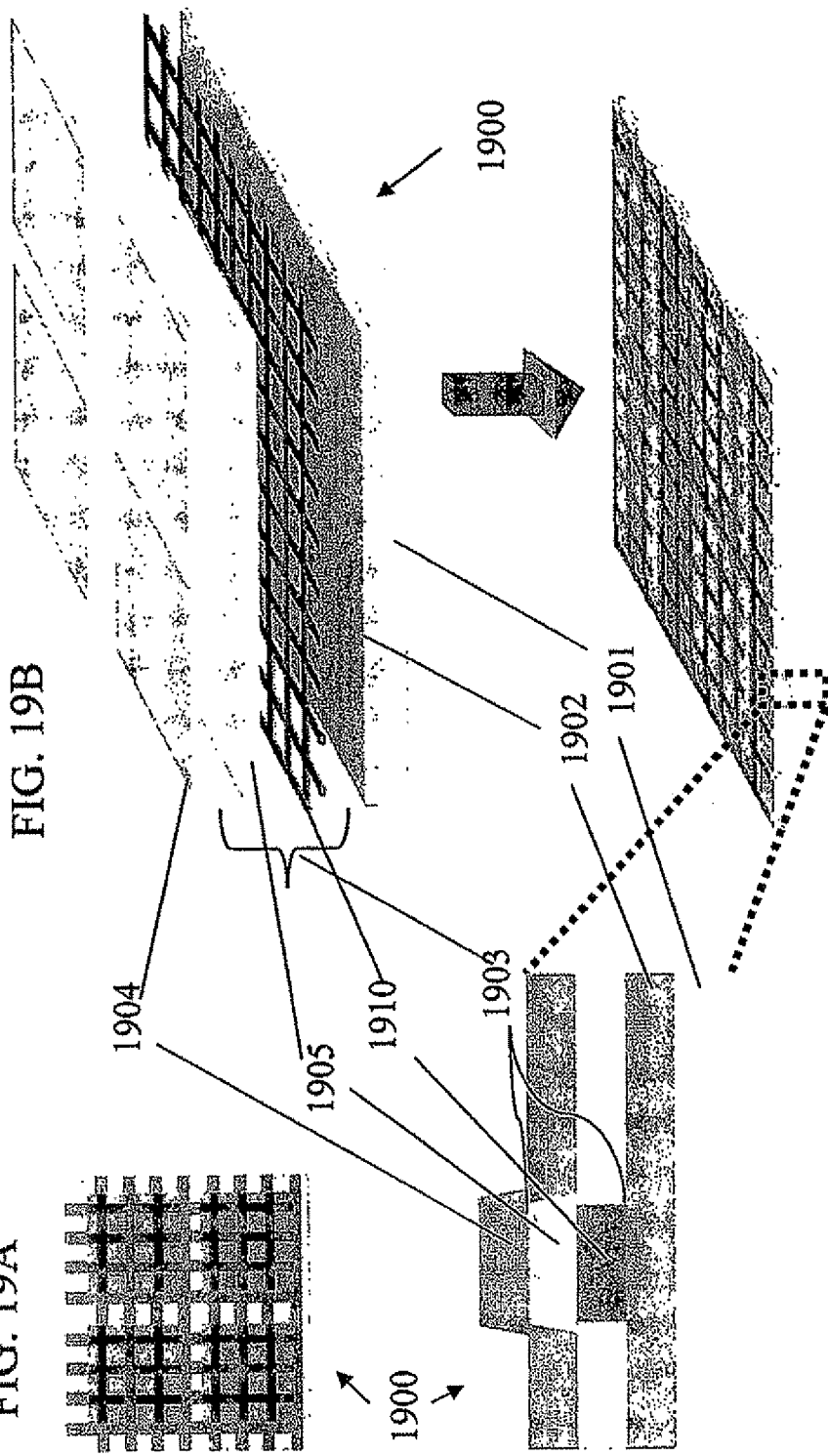

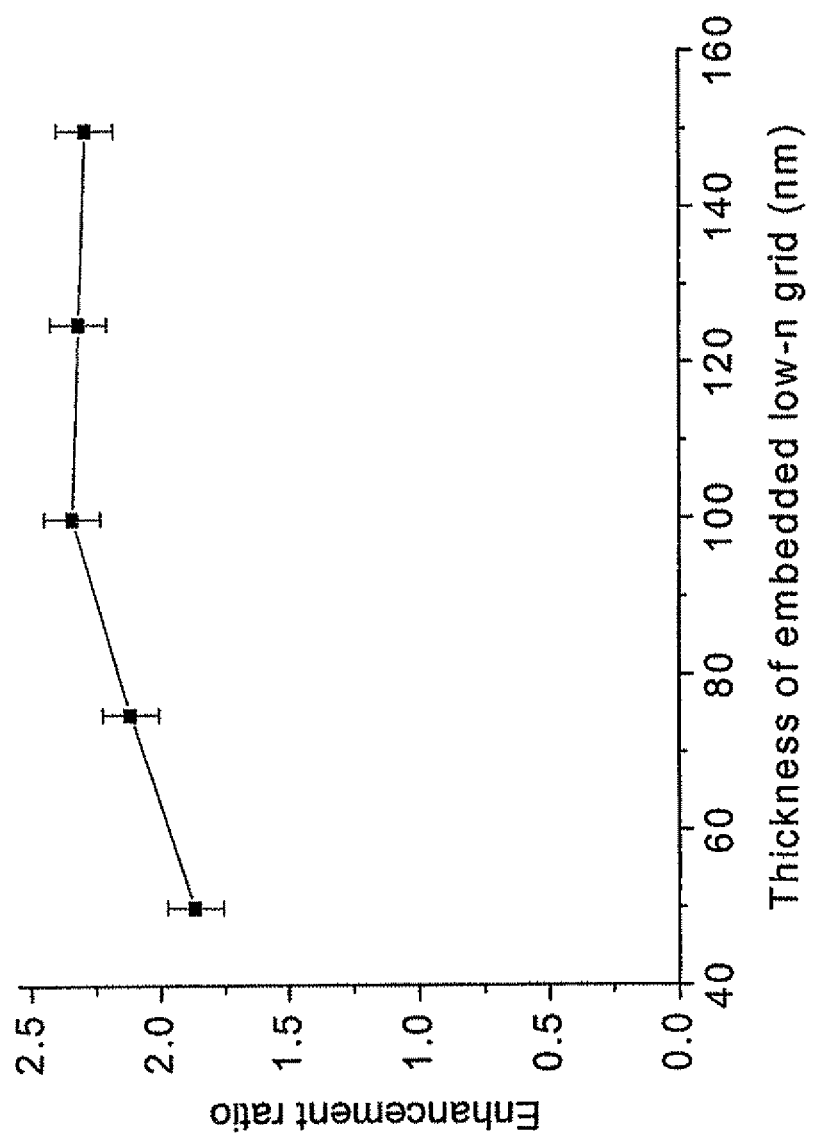

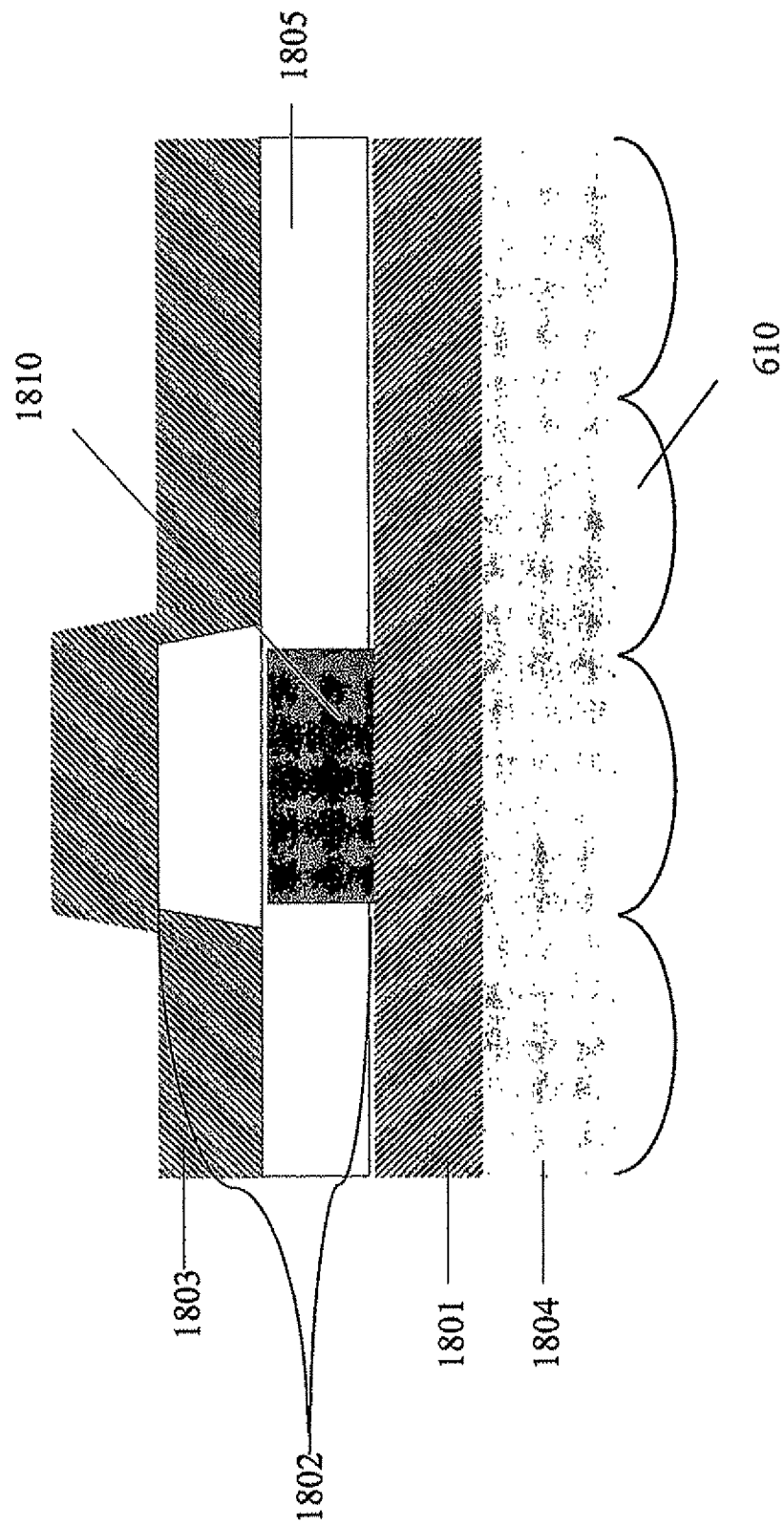

OLED WITH IMPROVED LIGHT OUTCOUPLING

CROSS-REFERENCE TO RELATED APPLICATION

This application is a continuation-in-part application of U.S. application Ser. No. 11/729,877, filed Mar. 30, 2007, now abandoned and U.S. application Ser. No. 12/059,783 filed Mar. 31, 2008 now abandoned. This application also claims the benefit of U.S. Provisional Patent Application No. 61/070,329, filed Mar. 21, 2008. All of these aforementioned applications are incorporated herein by reference in their entireties.

GOVERNMENT RIGHTS

This invention was made with U.S. Government support under Contract Nos. DE-FG02-04ER84113 and DE-FC26-04NT42272 awarded by the Department of Energy. The government has certain rights in this invention.

JOINT RESEARCH AGREEMENT

The claimed invention was made by, on behalf of, and/or in connection with one or more of the following parties to a joint university corporation research agreement: Princeton University, The University of Southern California, The University of Michigan and Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs), and more specifically to organic light emitting devices having a low refractive-index material that enhances light outcoupling.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules. In general, a small molecule has a well-defined chemical formula with a single molecular weight, whereas a polymer has a chemical formula and a molecular weight that may vary from molecule to molecule. As used herein, "organic" includes metal complexes of hydrocarbyl and heteroatom-substituted hydrocarbyl ligands.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in an organic opto-electronic devices. For example, a transparent electrode material, such as indium tin oxide (ITO), may be used as the bottom electrode. A transparent top electrode, such as disclosed in U.S. Pat. Nos. 5,703,436 and 5,707,745, which are incorporated by reference in their entireties, may also be used. For a device intended to emit light only through the bottom electrode, the top electrode does not need to be transparent, and may be comprised of a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

SUMMARY OF THE INVENTION

An OLED may include regions of a material having a refractive index less than that of the substrate, or the organic emissive material, allowing for emitted light in a waveguide mode to be extracted into air. These regions can be placed adjacent to the emissive regions of an OLED in a direction parallel to the electrodes. The substrate may also be given a nonstandard shape to further improve the conversion of waveguide mode and/or glass mode light to air mode. The outcoupling efficiency of such a device may be up to two to three times the efficiency of a standard OLED.

An OLED may be manufactured by depositing a first electrode over a substrate; depositing a grid of a low-index material having a refractive index of 1.0 to 1.5 over the first electrode; depositing an organic emissive material over the grid such that the organic emissive material is in direct contact with the grid or with the first electrode; and depositing a second electrode over the organic emissive material.

BRIEF DESCRIPTION OF THE DRAWINGS

FIG. 3A shows an organic light emitting device having regions of a transparent material with a low refractive index.

FIG. 6A shows a device having a microlens sheet.

FIG. 6B shows a device having a thin low-index layer disposed between the substrate and an electrode.

FIGS. 19A-19C show a transparent or top emitting OLED with a LIG embedded in the organic layer.

FIG. 20A-20C show simulated values for the enhancement in outcoupling efficiency for a transparent or top emitting OLED with a rectangular LIG.

FIG. 21 shows a transparent or top emitting OLED having a microlens sheet.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

Figure 1:
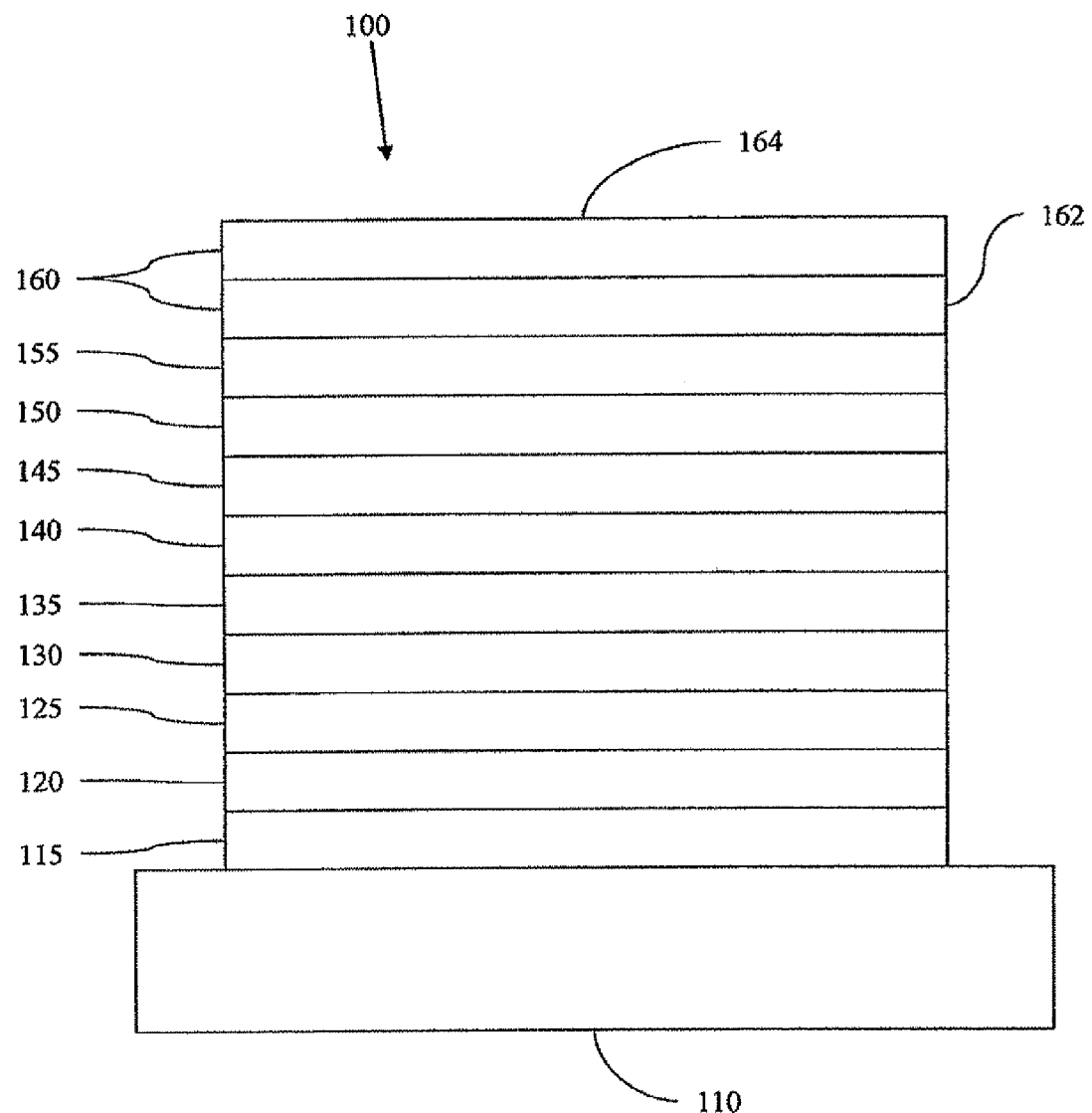
FIG. 1 shows an organic light emitting device having separate electron transport, hole transport, and emissive layers, as well as other layers.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order.

Substrate 110 may be any suitable substrate that provides desired structural properties. Substrate 110 may be flexible or rigid. Substrate 110 may be transparent, translucent or opaque. Plastic and glass are examples of preferred rigid substrate materials. Plastic and metal foils are examples of preferred flexible substrate materials. Substrate 110 may be a semiconductor material in order to facilitate the fabrication of circuitry. For example, substrate 110 may be a silicon wafer upon which circuits are fabricated, capable of controlling OLEDs subsequently deposited on the substrate. Other substrates may be used. The material and thickness of substrate 110 may be chosen to obtain desired structural and optical properties.

Anode 115 may be any suitable anode that is sufficiently conductive to transport holes to the organic layers. The material of anode 115 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 115 (and substrate 110) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pat. Nos. 5,844,363 and 6,602,540 B2, which are incorporated by reference in their entireties. Anode 115 may be opaque and/or reflective. A reflective anode 115 may be preferred for some top-emitting devices, to increase the amount of light emitted from the top of the device. The material and thickness of anode 115 may be chosen to obtain desired conductive and optical properties. Where anode 115 is transparent, there may be a range of thickness for a particular material that is thick enough to provide the desired conductivity, yet thin enough to provide the desired degree of transparency. Other anode materials and structures may be used.

Hole transport layer 125 may include a material capable of transporting holes. Hole transport layer 130 may be intrinsic (undoped), or doped. Doping may be used to enhance conductivity. α-NPD and TPD are examples of intrinsic hole transport layers. An example of a p-doped hole transport layer is m-MTDATA doped with $F_4$-TCNQ at a molar ratio of 50:1, as disclosed in United States Patent Application Publication No. 2003-0230980 to Forrest et al., which is incorporated by reference in its entirety. Other hole transport layers may be used.

Emissive layer 135 may include an organic material capable of emitting light when a current is passed between anode 115 and cathode 160. Preferably, emissive layer 135 contains a phosphorescent emissive material, although fluorescent emissive materials may also be used. Phosphorescent materials are preferred because of the higher luminescent efficiencies associated with such materials. Emissive layer 135 may also comprise a host material capable of transporting electrons and/or holes, doped with an emissive material that may trap electrons, holes, and/or excitons, such that excitons relax from the emissive material via a photoemissive mechanism. Emissive layer 135 may comprise a single material that combines transport and emissive properties. Whether the emissive material is a dopant or a major constituent, emissive layer 135 may comprise other materials, such as dopants that tune the emission of the emissive material. Emissive layer 135 may include a plurality of emissive materials capable of, in combination, emitting a desired spectrum of light. Examples of phosphorescent emissive materials include Ir(ppy)$_3$. Examples of fluorescent emissive materials include DCM and DMQA. Examples of host materials include Alq$_3$, CBP and mCP. Examples of emissive and host materials are disclosed in U.S. Pat. No. 6,303,238 to Thompson et al., which is incorporated by reference in its entirety. Emissive material may be included in emissive layer 135 in a number of ways. For example, an emissive small molecule may be incorporated into a polymer. This may be accomplished by several ways: by doping the small molecule into the polymer either as a separate and distinct molecular species; or by incorporating the small molecule into the backbone of the polymer, so as to form a co-polymer; or by bonding the small molecule as a pendant group on the polymer. Other emissive layer materials and structures may be used. For example, a small molecule emissive material may be present as the core of a dendrimer.

Electron transport layer 145 may include a material capable of transporting electrons. Electron transport layer 145 may be intrinsic (undoped), or doped. Doping may be used to enhance conductivity. Alq$_3$ is an example of an intrinsic electron transport layer. An example of an n-doped electron transport layer is BPhen doped with Li at a molar ratio of 1:1, as disclosed in United States Patent Application Publication No. 2003-02309890 to Forrest et al., which is incorporated by reference in its entirety. Other electron transport layers may be used.

Cathode 160 may be any suitable material or combination of materials known to the art, such that cathode 160 is capable of conducting electrons and injecting them into the organic layers of device 100. Cathode 160 may be transparent or opaque, and may be reflective. Metals and metal oxides are examples of suitable cathode materials. Cathode 160 may be a single layer, or may have a compound structure. FIG. 1 shows a compound cathode 160 having a thin metal layer 162 and a thicker conductive metal oxide layer 164. In a compound cathode, preferred materials for the thicker layer 164 include ITO, IZO, and other materials known to the art. U.S. Pat. Nos. 5,703,436, 5,707,745, 6,548,956 B2 and 6,576,134 B2, which are incorporated by reference in their entireties, disclose examples of cathodes including compound cathodes having a thin layer of metal such as Mg:Ag with an overlying transparent, electrically-conductive, sputter-deposited ITO layer. The part of cathode 160 that is in contact with the underlying organic layer, whether it is a single layer cathode 160, the thin metal layer 162 of a compound cathode, or some other part, is preferably made of a material having a work function lower than about 4 eV (a "low work function material"). Other cathode materials and structures may be used.

Blocking layers may be used to reduce the number of charge carriers (electrons or holes) and/or excitons that leave the emissive layer. An electron blocking layer 130 may be disposed between emissive layer 135 and the hole transport layer 125, to block electrons from leaving emissive layer 135 in the direction of hole transport layer 125. Similarly, a hole blocking layer 140 may be disposed between emissive layer 135 and electron transport layer 145, to block holes from leaving emissive layer 135 in the direction of electron transport layer 145. Blocking layers may also be used to block excitons from diffusing out of the emissive layer. The theory and use of blocking layers is described in more detail in U.S. Pat. No. 6,097,147 and United States Patent Application Publication No. 2003-02309890 to Forrest et al., which are incorporated by reference in their entireties.

As used herein, and as would be understood by one skilled in the art, the term "blocking layer" means that the layer provides a barrier that significantly inhibits transport of charge carriers and/or excitons through the device, without suggesting that the layer necessarily completely blocks the charge carriers and/or excitons. The presence of such a blocking layer in a device may result in substantially higher efficiencies as compared to a similar device lacking a blocking layer. Also, a blocking layer may be used to confine emission to a desired region of an OLED.

Generally, injection layers are comprised of a material that may improve the injection of charge carriers from one layer, such as an electrode or an organic layer, into an adjacent organic layer. Injection layers may also perform a charge transport function. In device 100, hole injection layer 120 may be any layer that improves the injection of holes from anode 115 into hole transport layer 125. CuPc is an example of a material that may be used as a hole injection layer from an ITO anode 115, and other anodes. In device 100, electron injection layer 150 may be any layer that improves the injection of electrons into electron transport layer 145. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 100. More examples of injection layers are provided in U.S. patent application Ser. No. 09/931,948 to Lu et al., which is incorporated by reference in its entirety. A hole injection layer may comprise a solution deposited material, such as a spin-coated polymer, e.g., PEDOT:PSS, or it may be a vapor deposited small molecule material, e.g., CuPc or MTDATA.

A hole injection layer (HIL) may planarize or wet the anode surface so as to provide efficient hole injection from the anode into the hole injecting material. A hole injection layer may also have a charge carrying component having HOMO (Highest Occupied Molecular Orbital) energy levels that favorably match up, as defined by their herein-described relative ionization potential (IP) energies, with the adjacent anode layer on one side of the HIL and the hole transporting layer on the opposite side of the HIL. The "charge carrying component" is the material responsible for the HOMO energy level that actually transports holes. This component may be the base material of the HIL, or it may be a dopant. Using a doped HIL allows the dopant to be selected for its electrical properties, and the host to be selected for morphological properties such as wetting, flexibility, toughness, etc. Preferred properties for the HIL material are such that holes can be efficiently injected from the anode into the HIL material. In particular, the charge carrying component of the HIL preferably has an IP not more than about 0.7 eV greater that the IP of the anode material. More preferably, the charge carrying component has an IP not more than about 0.5 eV greater than the anode material. Similar considerations apply to any layer into which holes are being injected. HIL materials are further distinguished from conventional hole transporting materials that are typically used in the hole transporting layer of an OLED in that such HIL materials may have a hole conductivity that is substantially less than the hole conductivity of conventional hole transporting materials. The thickness of the HIL of the present invention may be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm may be desired in some cases.

A protective layer may be used to protect underlying layers during subsequent fabrication processes. For example, the processes used to fabricate metal or metal oxide top electrodes may damage organic layers, and a protective layer may be used to reduce or eliminate such damage. In device 100, protective layer 155 may reduce damage to underlying organic layers during the fabrication of cathode 160. Preferably, a protective layer has a high carrier mobility for the type of carrier that it transports (electrons in device 100), such that it does not significantly increase the operating voltage of device 100. CuPc, BCP, and various metal phthalocyanines are examples of materials that may be used in protective layers. Other materials or combinations of materials may be used. The thickness of protective layer 155 is preferably thick enough that there is little or no damage to underlying layers due to fabrication processes that occur after organic protective layer 160 is deposited, yet not so thick as to significantly increase the operating voltage of device 100. Protective layer 155 may be doped to increase its conductivity. For example, a CuPc or BCP protective layer 160 may be doped with Li. A more detailed description of protective layers may be found in U.S. patent application Ser. No. 09/931,948 to Lu et al., which is incorporated by reference in its entirety.

Figure 2:
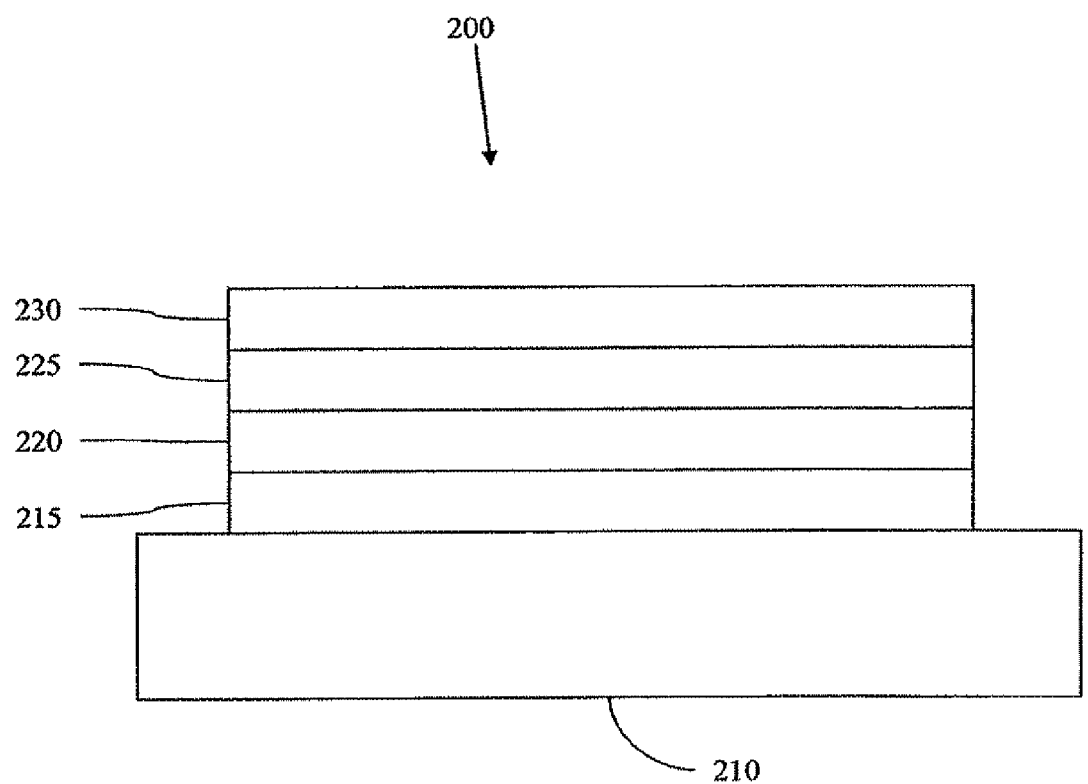
FIG. 2 shows an inverted organic light emitting device that does not have a separate electron transport layer.

FIG. 2 shows an inverted OLED 200. The device includes a substrate 210, an cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190, Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In many cases, a large portion of light originating in an emissive layer within an OLED does not escape the device due to internal reflection at the air interface, edge emission, dissipation within the emissive or other layers, waveguide effects within the emissive layer or other layers of the device (i.e., transporting layers, injection layers, etc.), and other effects. Light generated and/or emitted by an OLED may be described as being in various modes, such as "air mode" (the light will be emitted from a viewing surface of the device, such as through the substrate) or "waveguide mode" (the light is trapped within the device due to waveguide effects). Specific modes may be described with respect to the layer or layers within which the light is trapped, such as "organic mode" (the light is trapped within one or more of the organic layers), "electrode mode" (trapped within an electrode), and "substrate mode" or "glass mode" (trapped within the substrate). In a typical OLED, up to 50-60% of light generated by the emissive layer may be trapped in a waveguide mode, and therefore fail to exit the device. Additionally, up to 20-30% of light emitted by the emissive material in a typical OLED can remain in a glass mode. Thus, the outcoupling efficiency of a typical OLED may be as low as about 20%.

To improve the outcoupling efficiency of an OLED, regions of a transparent material having a low refractive index may be placed adjacent to regions containing an emissive material, in a direction parallel to one or both of the OLED electrodes. These regions may cause light emitted by the emissive material to enter a glass mode or air mode, increasing the proportion of emitted light that ultimately leaves the device.

It is believed that the external quantum efficiencies of top and transparent emitting OLEDs may be enhanced by 2 to 3 times by embedding periods of low index material in these devices without distorting the viewing spectra. It is understood that a transparent emitting OLED refers to an OLED having substantially transparent top and bottom electrodes. It is also understood that a top emitting OLED refers to an OLED intended to emit light only through the top (transparent) electrode.

FIG. 3A shows a side schematic view of an exemplary device 300 having low-index regions 310. The device includes a substrate 304, electrodes 301 and 303, and a layer 302 that has regions of one or more emissive materials 305 and regions of a transparent low-index material 310. It will be understood that the device shown in FIG. 3A may also include the various other layers and structures described herein.

The low-index material preferably contains a material that has a refractive index that is less than the refractive index of the substrate, and more preferably that is 0.15 to 0.4 less than the refractive index of the substrate, as this may increase the amount of waveguide mode light that is converted to air mode and/or glass mode. It may be preferred for the low-index material to have a refractive index of 1.0 to 1.3, and more preferably 1.0 to 1.05. Often the low-index material will have a refractive index lower than the refractive index of the organic materials used in the device, since organic materials used in OLEDs typically have a refractive index of about 1.5-1.7. Various low-index materials may be used for the low-index region, such as TEFLON® (polytetrafluoroethylene), aerogels, graded films of $SiO_2$ and $TiO_2$, and layers of $SiO_2$ nanorods. Various aerogels are known in the art, such as silica, carbon, alumina, and other aerogels. For example, a silica aerogel can be made by mixing a liquid alcohol with a silicon alkoxide precursor to form a silicon dioxide sol gel. The alcohol is then removed from the gel and replaced with a gas using various techniques known in the art. An aerogel prepared using a sol-gel method may be preferred in some configurations, since the refractive index can be controlled by changing the ratios of the starting solutions. It is also preferred that the low-index material be transparent. As used herein, a material is "transparent" if, at the scale and dimension described for the low-index layers and regions, the total optical loss for light passing through the low-index layer or region in a direction roughly parallel to the electrodes is less than about 50%. The low-index material may also be a non-emissive material.

By way of illustration, FIG. 3A shows exemplary rays 320, 330, 340 to indicate various possible outcomes when light is emitted by emissive material in the OLED. Although some light 330 produced by the emissive material may directly exit the device, the light 320 produced in a waveguide mode would typically be unable to exit the emissive layer. In the ray-based optics example shown in FIG. 3A, such light 320 may be modeled as traveling within the emissive layer at a sufficiently large angle relative to the electrode normal that it will never be incident on the emissive layer interface. Similarly, waveguide mode light 340 may be modeled as a ray that is incident on the emissive layer interface, but at a sufficiently high angle θ to undergo total internal reflection. Such light would normally not be emitted from either the top or bottom of the device 300, but may be emitted from a side surface. However, low-index regions next to the emissive regions may allow light that would not normally be emitted by the device, or that would only be emitted from a side of the device, to exit through a viewing surface of the device. As shown in FIG. 3A, light entering the low-index regions is refracted, allowing it to exit the device directly (320) or after reflecting off an electrode (340). That is, light passing through the low-index regions may be converted from waveguide mode to air mode, allowing it to be emitted from the device.

Figure 3C:
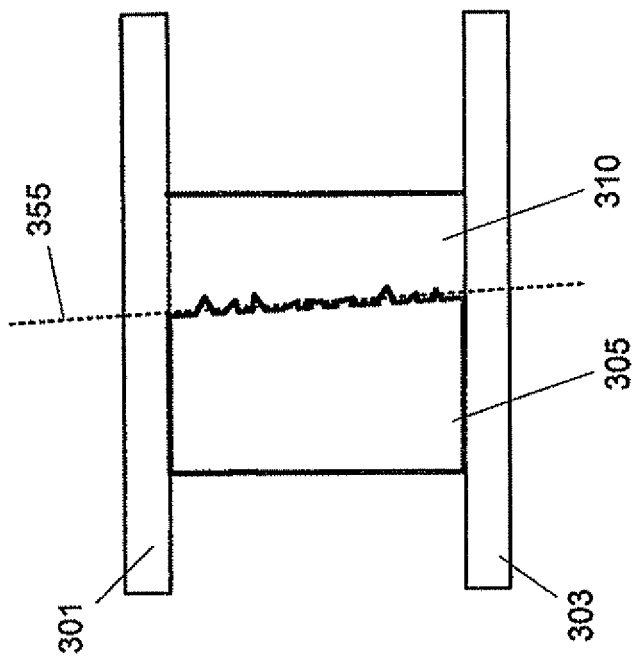
FIG. 3C shows a portion of a device where the boundary between adjacent regions is rough.
Figure 3B:
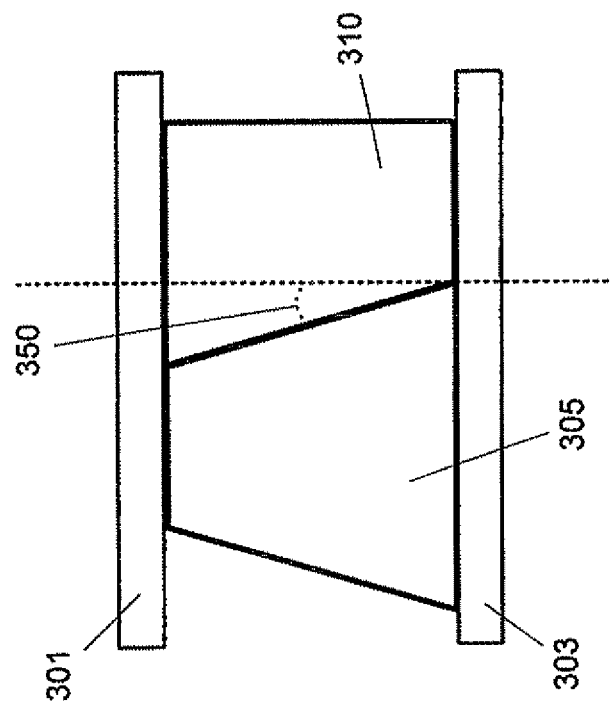
FIG. 3B shows a portion of a device where the boundary between adjacent regions is roughly perpendicular.

Although FIG. 3A shows the boundaries between low-index regions 310 and adjacent organic regions 305 as being flat interfaces perpendicular to the electrodes and substrate, this may not always be the case. For example, various deposition methods may be used for the low-index regions and/or the organic regions that result in rough boundaries, or boundaries that are not perpendicular to the substrate. FIG. 3B shows an example of a portion of a device where the boundary between a low-index region 310 and an adjacent organic region 305 is not precisely perpendicular to the electrodes 301, 303. Although a specific configuration is illustrated, it will be understood that the regions may have various different cross-sections from those shown. Generally, it is preferred that the boundary between adjacent regions 305, 310 is roughly perpendicular to an electrode of the device. As used herein, the boundary between two adjacent regions is "roughly perpendicular" to a surface if the angle between the boundary and a plane normal to the surface is 20° or less. Thus, in FIG. 3B the boundary between regions 305 and 310 is roughly perpendicular to the electrode 303 when the illustrated angle 350 is 20° or less. The boundary between adjacent regions also may be rough, as illustrated in FIG. 3C. In such a configuration, the regions are "roughly perpendicular" to a surface if the angle between a best-fit plane 355 and a plane normal to the surface of the device is 20° or less. Thus, the boundary between the regions 305, 310 shown in FIG. 3C is roughly perpendicular to the electrode 303 when the angle between the best-fit plane 355 and a plane normal to the electrode 303 is 20° or less. Although the drawings described herein generally will be understood not to be drawn to scale, it especially will be understood that features illustrated in FIGS. 3B-3C may be exaggerated for illustration.

Figure 3D:
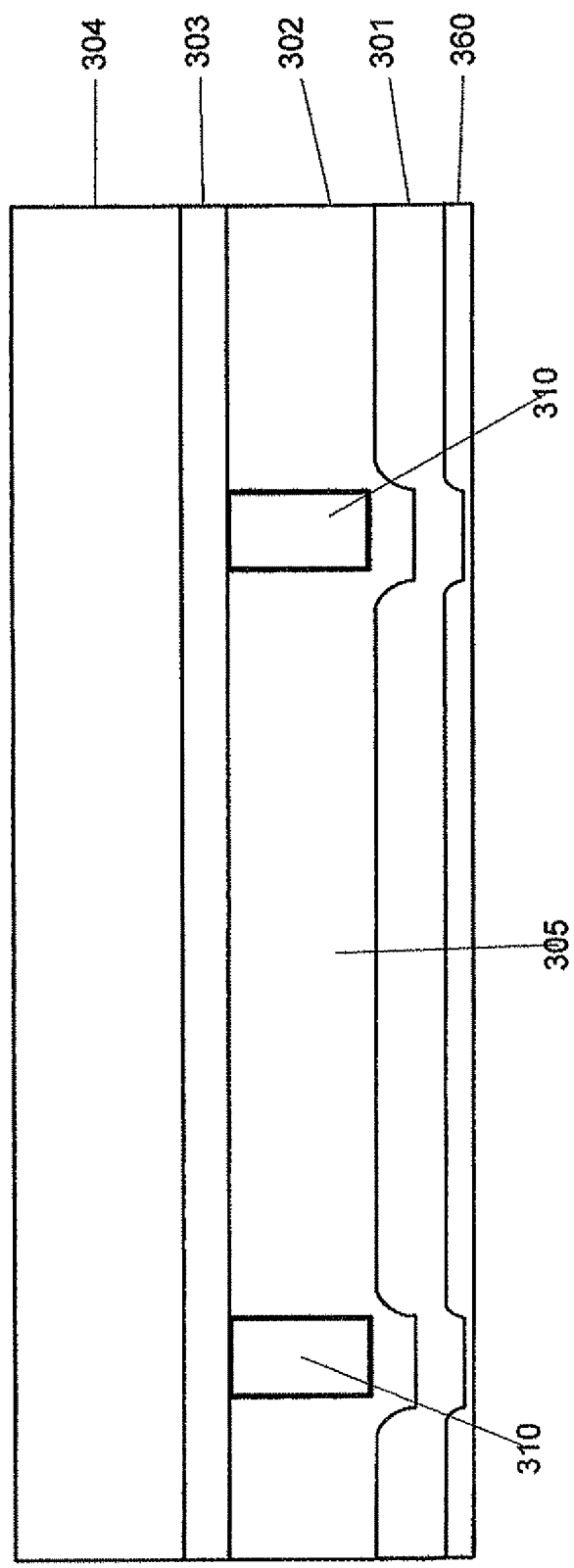
FIG. 3D shows an organic light emitting device having regions of a transparent material with a low refractive index.

The low-index region(s) may extend partially between the electrodes and/or other layers, as shown in FIG. 3D. For example, a low-index material 310 may be deposited on an electrode 303. The low-index material may be deposited in the various patterns, grids, and other structures as previously described. One or more organic materials 305 may then be deposited over the electrode 303 and the low-index regions 310, resulting in an organic layer with an uneven surface. An electrode 301 or other layer may be deposited on the organic layer 305, such that the resulting surface is also uneven, or the electrode 301 or other layer may be deposited so as to create a smooth surface. A smoothing layer 360 or other layer may also be deposited to create an even surface.

Figure 4A:
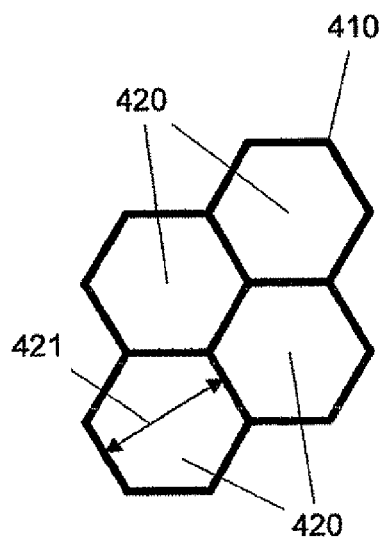
FIGS. 4A and 4B show top views of exemplary configurations of a low-index region.
Figure 4B:
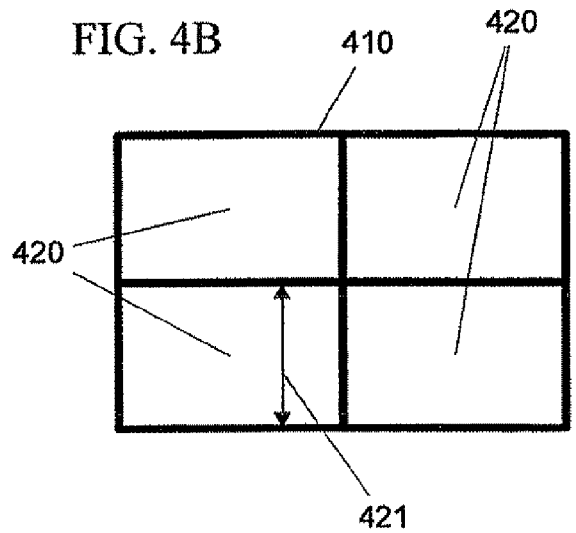

The low-index region may be arranged in various configurations within the device. It may be preferred for the low-index material to be arranged in a grid. As used herein, a "grid" refers to a repeating pattern of the material. FIGS. 4A-4B show exemplary arrangements of the low-index material and regions for use within a device. FIG. 4A shows a top view of a low-index material 410 arranged in a hexagonal grid. FIG. 4B shows a top view of a low-index material 410 arranged in a rectangular grid. The structures shown in FIGS. 4A-4B may be placed within an OLED in a plane parallel to one or both of the electrodes. Such a device may then have a cross-section equivalent to the device illustrated in FIG. 3A. Emissive regions 420 can include emissive material, charge transport and/or blocking materials, and the other structures and layers described herein. Although it may be preferred for each repeated portion of the grid to have approximately the same dimensions, portions of the grid may have varying dimensions. For a regular pattern, i.e., one where regions of emissive material are surrounded by low-index regions each having the same dimension, the grid may be characterized by a width 421. For example, a regular rectangular grid has emissive regions that are square when viewed from above. Other grid types, such as triangular or octagonal, also may be used, as well as various other patterns and structures.

Figure 5A:
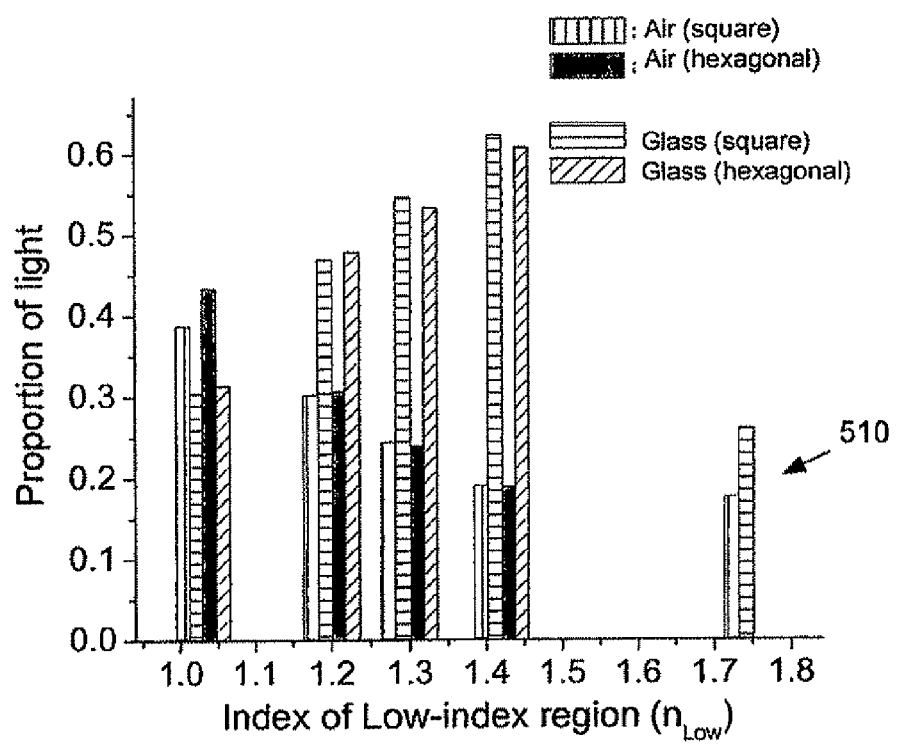
FIG. 5A shows simulated values for the amount of light converted to air mode and glass mode for a device having a low-index region.

In some cases, the specific shape of the grid may be selected based on desired qualities of the resulting device. For example, FIG. 5A shows simulated values for the amount of light that is converted to air mode and glass mode for a device having low-index material in arranged in the grids shown in FIGS. 4A and 4B for a range of refractive indices. The data is simulated for a device having organic emissive regions about 5 μm wide, low-index regions about 0.8 μm wide, and a top ITO electrode 100 nm thick. The amount of light ultimately converted to air mode in a device having a square grid (vertical hashing) and a hexagonal grid (solid), and to glass mode in a device having a square grid (horizontal hatching) and a hexagonal grid (diagonal hatching) is shown. The levels approach those for a conventional OLED, i.e., one without low-index regions, when the low-index region is modeled as having a refractive index around 1.7-1.8 (510). This is expected, since organic materials typically used in OLEDs can have refractive indices of about 1.7-1.8.

Figure 5B:
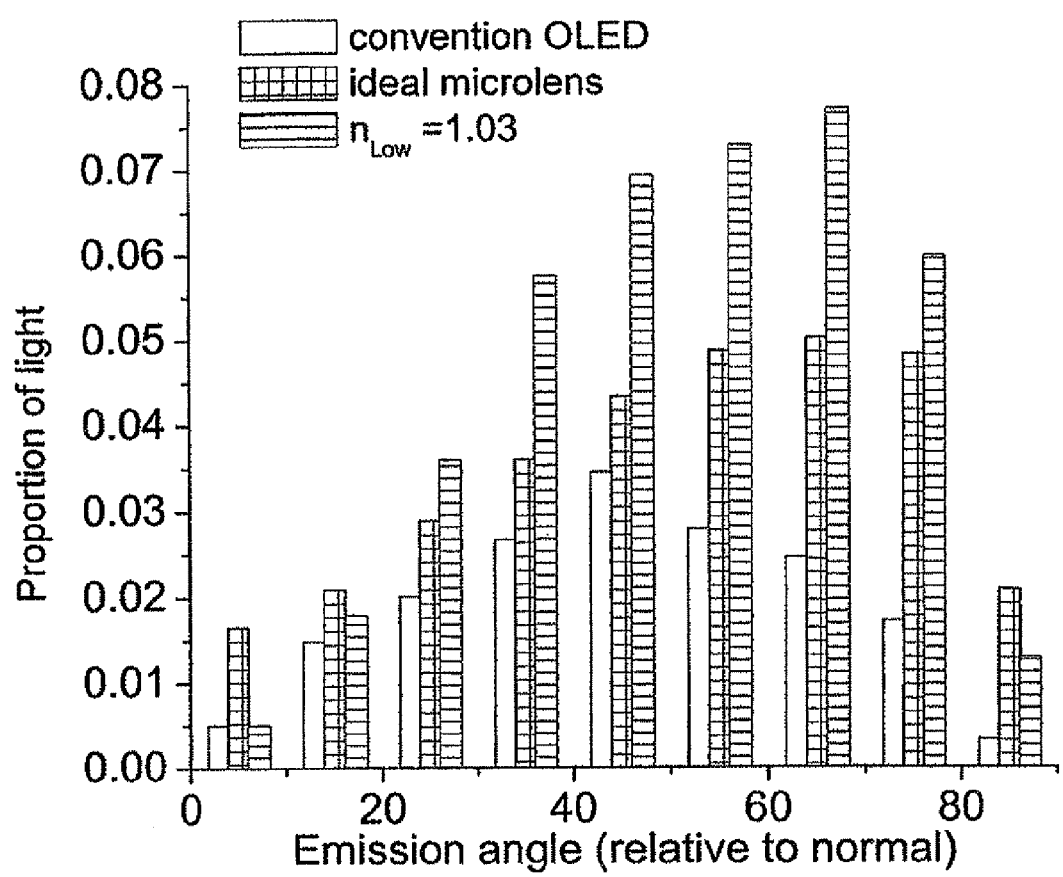
FIG. 5B shows simulated emission for a device having a hexagonal grid of a low-index material having a refractive index of 1.03.

FIG. 5B shows simulated emission for a device having a hexagonal grid of a low-index material having a refractive index of 1.03. The width of the emissive regions is 5 μm, the width of the low-index regions is 0.8 μm, and the electrode is a 100 nm ITO layer. When the low-index regions are used (horizontal hatching), the outcoupling efficiency of the device may increase to 0.44, as shown. An OLED with an ideal microlens disposed on the viewing surface (crosshatching) generally has an outcoupling efficiency of about 0.32, while the measured value for such a device is generally about 0.26. For a conventional OLED (no hatching), the outcoupling efficiency of the modeled device is about 0.17.

As shown in FIG. 5A, as the refractive index of the low-index region increases, more light is converted to glass mode and less is converted to air mode. In some cases it may be useful to change the substrate-air interface so that it is not parallel to the plane of the organic layer, thus causing more light to be converted from a glass mode to air mode. Thus, the low-index region may have a synergistic effect with configurations that enhance conversion from glass mode to air mode. Specifically, the low-index region may convert light from an organic mode to a glass mode, and the glass mode light may be converted to air mode due to the substrate configuration or composition. For example, a microlens sheet 610 as shown in FIG. 6A may be disposed adjacent to the substrate, or the substrate may include a microlens or microlens sheet. Other configurations may be used, such as a centimeter-scale hemispherical glass lens, or a substrate having a roughened surface at the substrate-air interface. The substrate may also include different materials, such as materials having different indices of refraction; this can also increase the amount of glass mode light converted to air mode. As shown in FIG. 6B, a thin layer 620 of a low-index material such as aerogel or TEFLON® (polytetrafluoroethylene) may also be disposed between the substrate 304 and the electrode 303. This layer may also direct more otherwise glass mode light into an electrode or organic mode, where it will eventually enter a low-index region and become glass mode light.

Figure 7:
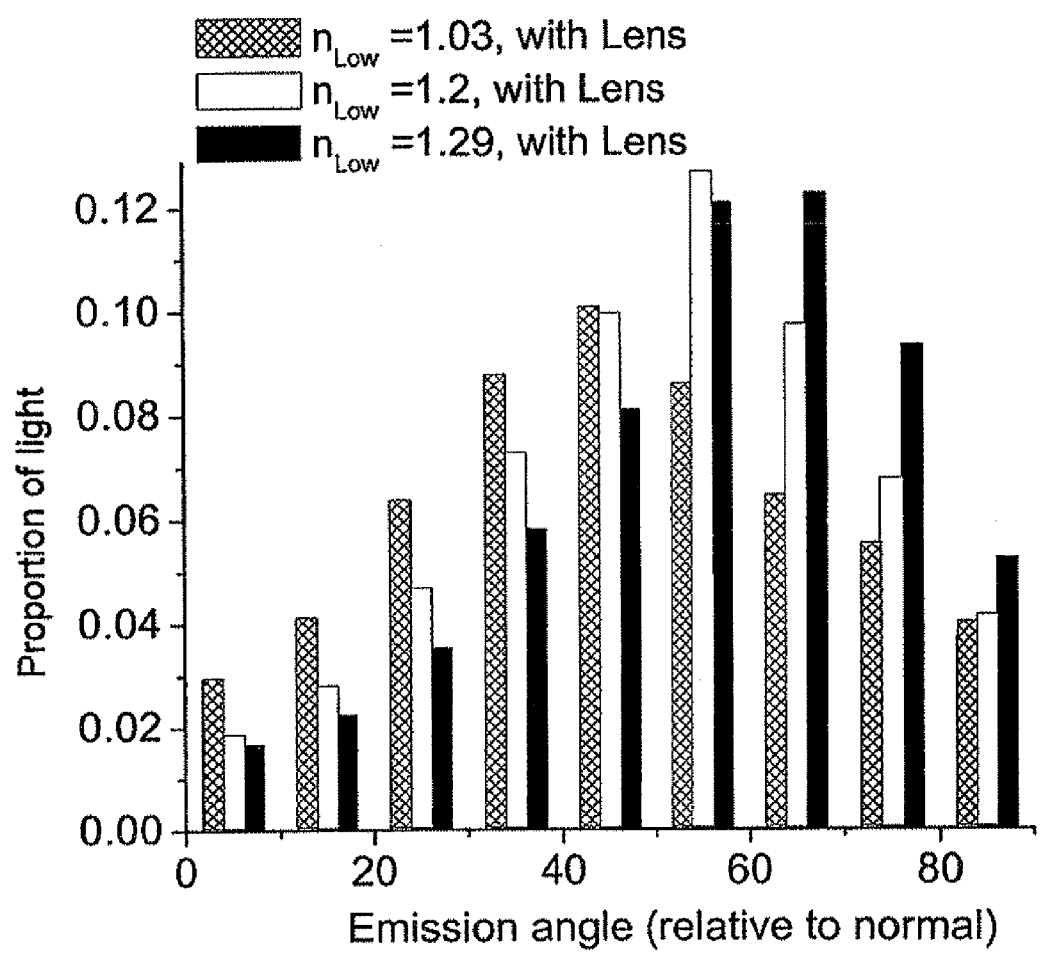
FIG. 7 shows the proportion of light emitted by a device with a microlens, having a hexagonal grid of low-index material for a range of refractive indices.
Figure 8:
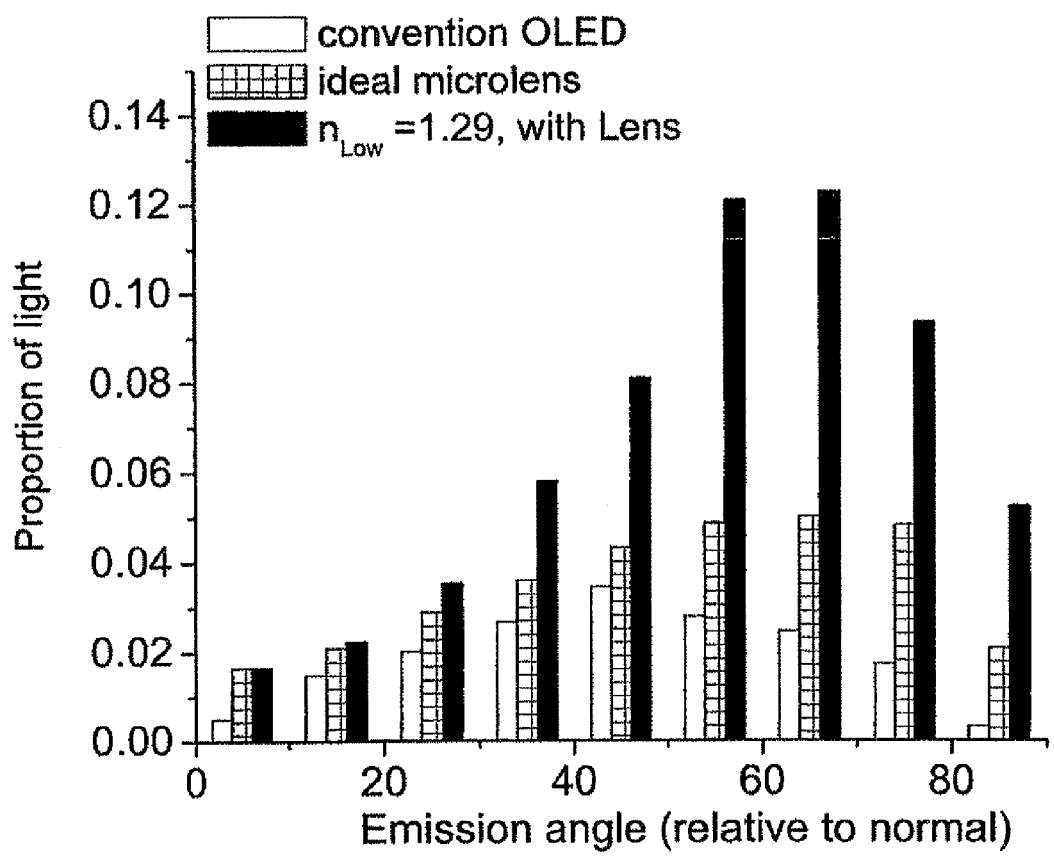
FIG. 8 shows the proportion of light emitted for a conventional OLED, an OLED with an ideal microlens, and an OLED with an ideal microlens and a hexagonal grid of a low-index material with a refractive index of 1.29.

FIGS. 7 and 8 show the calculated proportion of light emitted by a device having the same basic structure as the device of FIG. 5B as a function of the viewing angle. FIG. 7 shows the proportion of light emitted by a device with a microlens, having a hexagonal grid of low-index material with a refractive index of 1.03 (cross-hatching), 1.2 (no hatching), and 1.29 (solid). As illustrated, the outcoupling efficiency of the device may be as high as 0.60. FIG. 8 shows the proportion of light emitted for a conventional OLED (no hatching), an OLED with an ideal microlens (cross-hatching), and an OLED with an ideal microlens and a hexagonal grid of a low-index material with a refractive index of 1.29 (solid).

Figure 9:
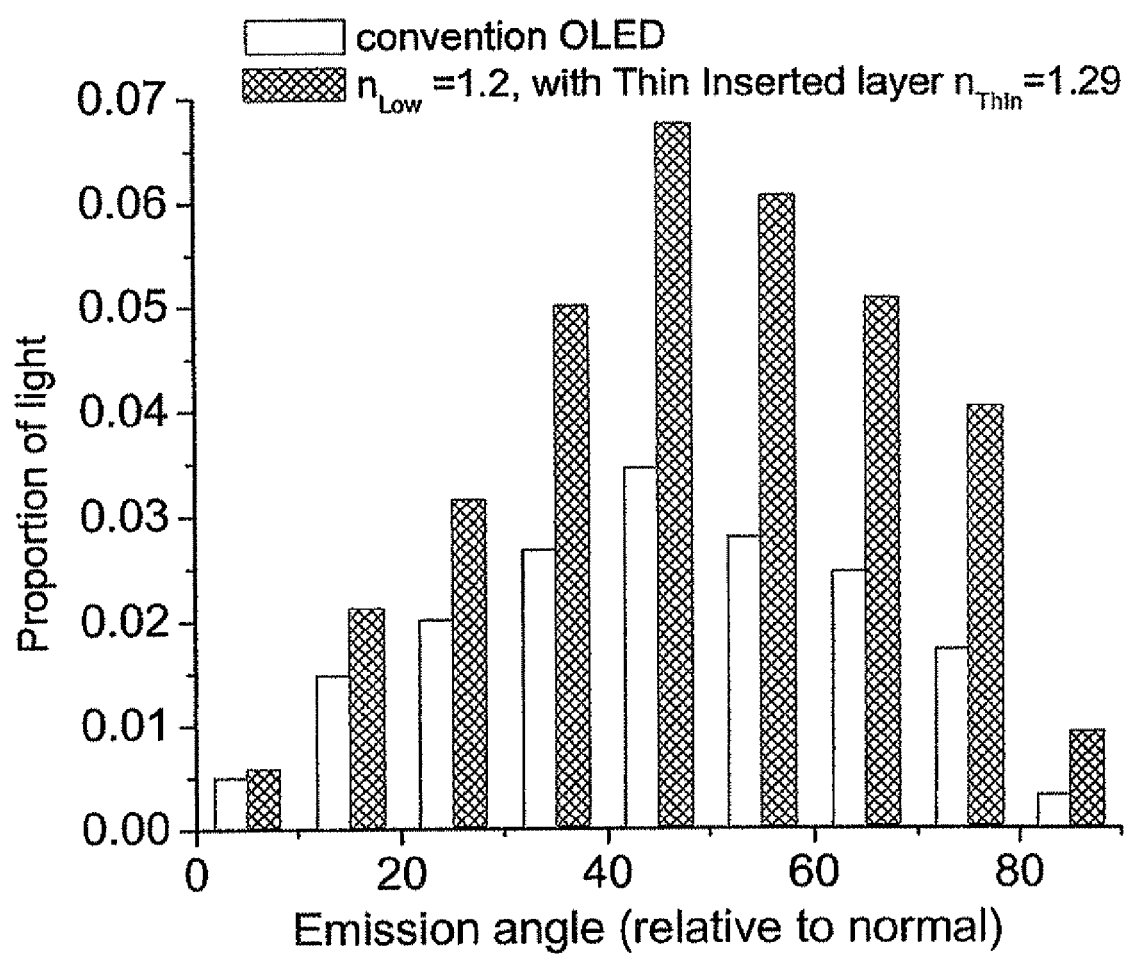
FIG. 9 shows the light emitted by a conventional OLED and by an OLED with a hexagonal grid of a low-index material having a refractive index of 1.2 and an inserted layer of TEFLON® (polytetrafluoroethylene) AF having a refractive index of 1.29.
Figure 10:
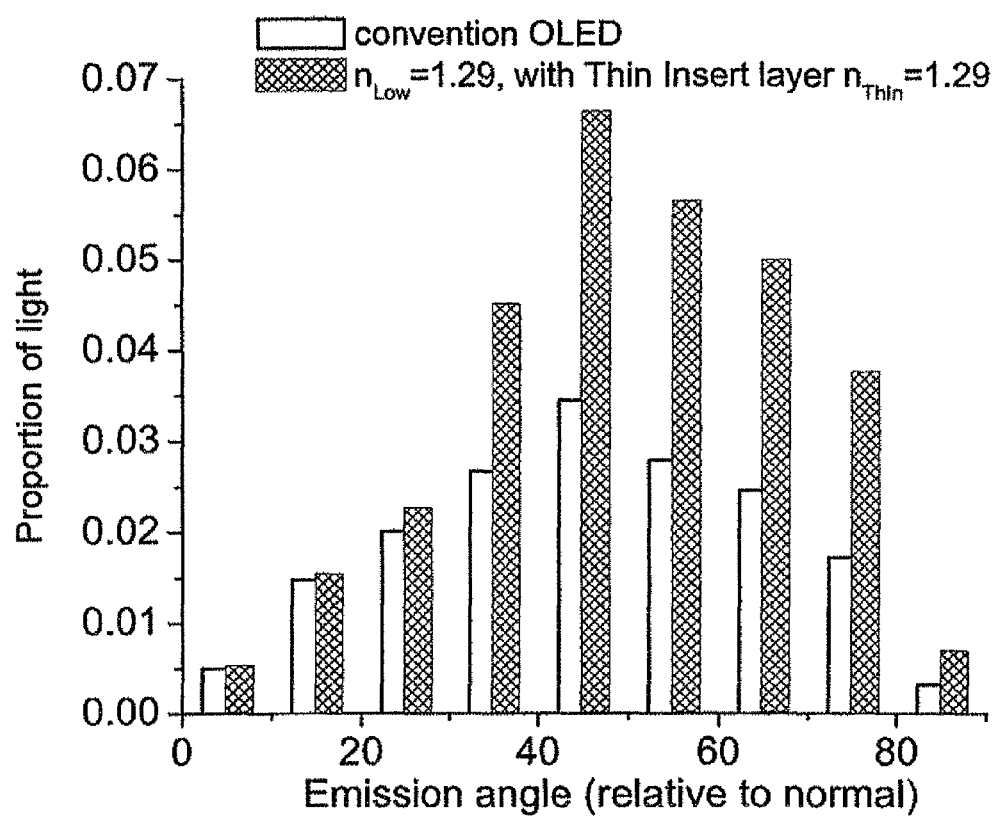
FIG. 10 shows the emission for a device having the same structure as FIG. 9, but with the low-index material having a refractive index of 1.29.

FIGS. 9 and 10 show the calculated proportion of light emitted as a function of the emission angle. The device has the same structure as previously described, as well as a thin layer of a low-index material inserted between the ITO electrode and the emissive material, and low-index regions separating adjacent regions of emissive material. FIG. 9 shows the light emitted by a conventional OLED (no hatching) and by an OLED with a hexagonal grid of a low-index material having a refractive index of 1.2 and an inserted layer of TEFLON® (polytetrafluoroethylene) AF having a refractive index of 1.29 (cross-hatching). FIG. 10 shows the emission for a device having the same structure as FIG. 9, but with the low-index material having a refractive index of 1.29. The outcoupling efficiency of the devices shown in FIGS. 9 and 10 may be 0.32 (for a low-index material refractive index of 1.29) to 0.34 (refractive index of 1.2).

Figure 11:
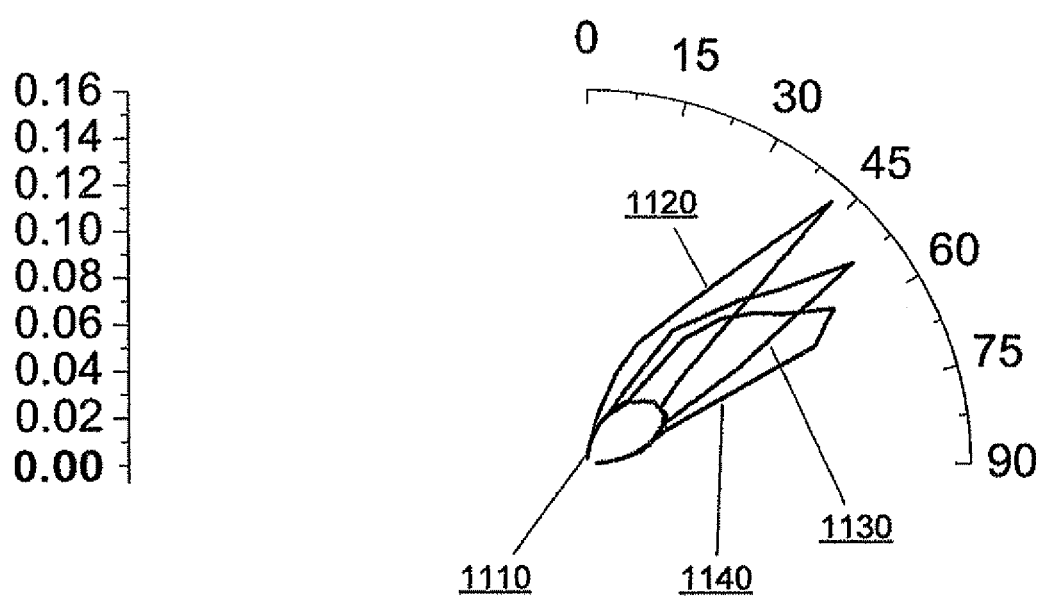
FIG. 11 shows the angular distribution of light in a glass substrate without a low-index layer.
Figure 12:
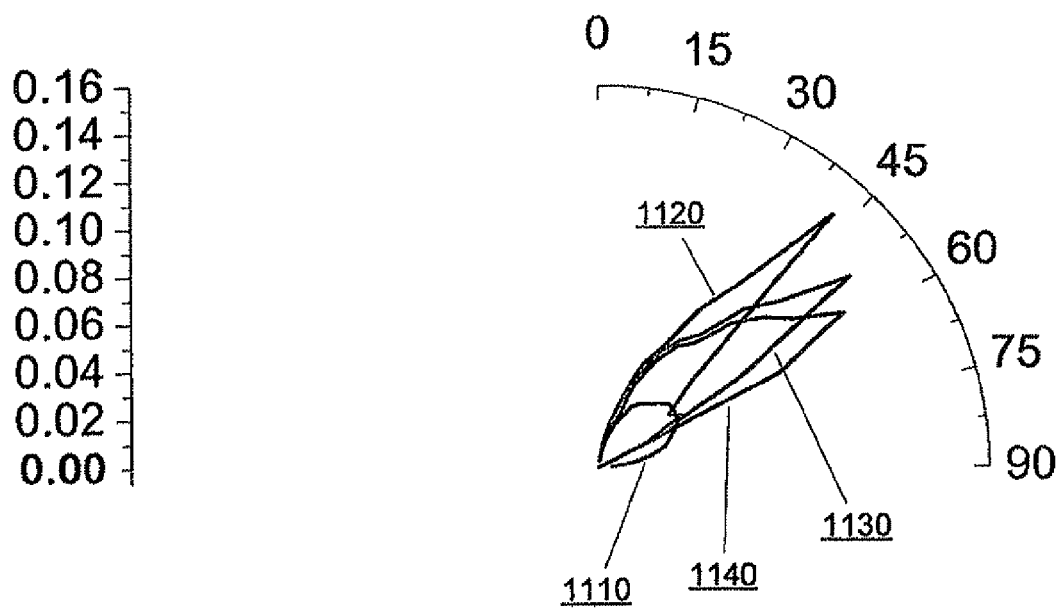
FIG. 12 shows the angular distribution of light in a glass substrate with a low-index layer.

The thin layer of low-index material may serve to change the angular distribution of light in the substrate, by reducing the amount of light that undergoes total internal reflection at the substrate-air interface. FIGS. 11 and 12 show the angular distribution of light in a glass substrate without the low-index layer and with a low-index layer of a material having a refractive index of 1.29, respectively. Distributions are shown for a conventional OLED (1110, 1120) and OLEDs with a low-index layer having refractive indices of 1.03 (1120, 1220), 1.02 (1130, 1230), and 1.3 (1130, 1230).

Figure 13:
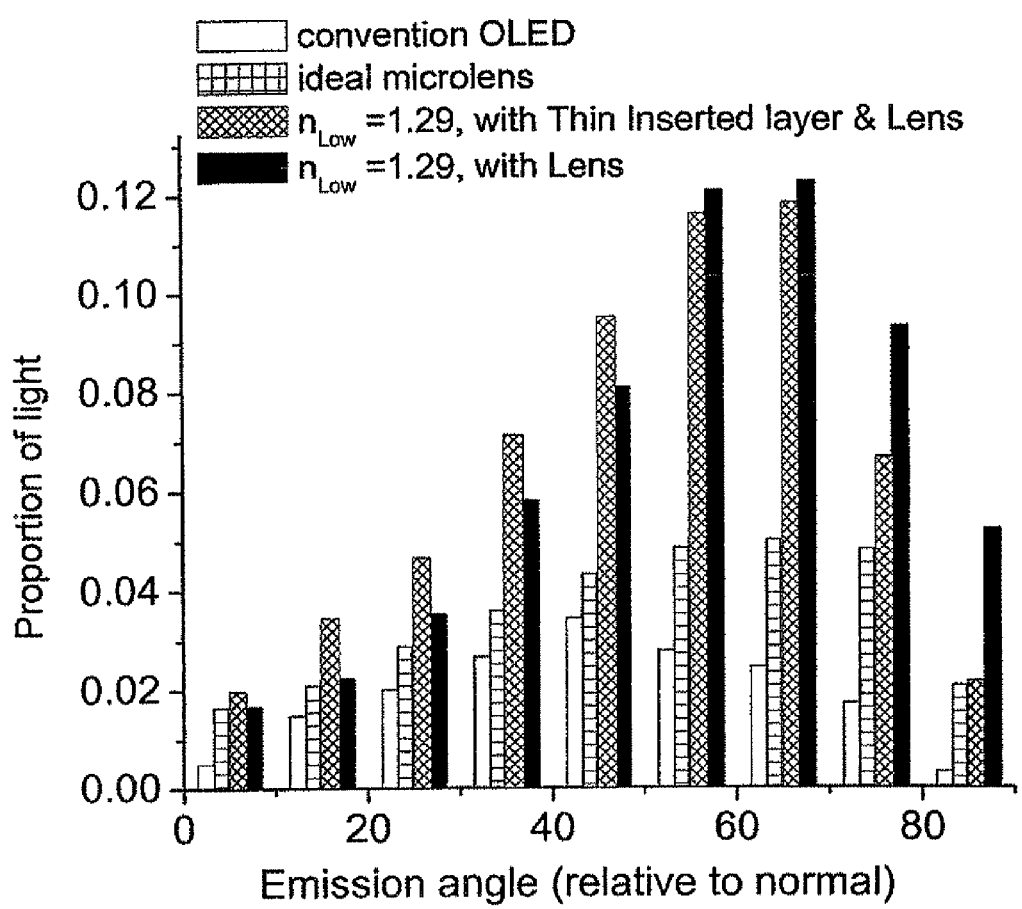
FIG. 13 shows the proportion of emitted light as a function of the emission angle for various device structures.

It may be useful to use the microlens sheet shown in FIG. 6A and the low-index layer illustrated in FIG. 6B in the same device. The outcoupling efficiency for such a device can be up to 0.59. FIG. 13 shows the proportion of emitted light as a function of the emission angle for various device structures. Values are shown for a conventional OLED (no hatching), an OLED with an ideal microlens (cross-hatching), an OLED with low-index regions having a refractive index of 1.29, a thin low-index layer and a microlens sheet (diagonal cross-hatching), and an OLED having a microlens sheet and a low-index regions with a region of low-index material having a refractive index of 1.29 (solid).

Figure 18:
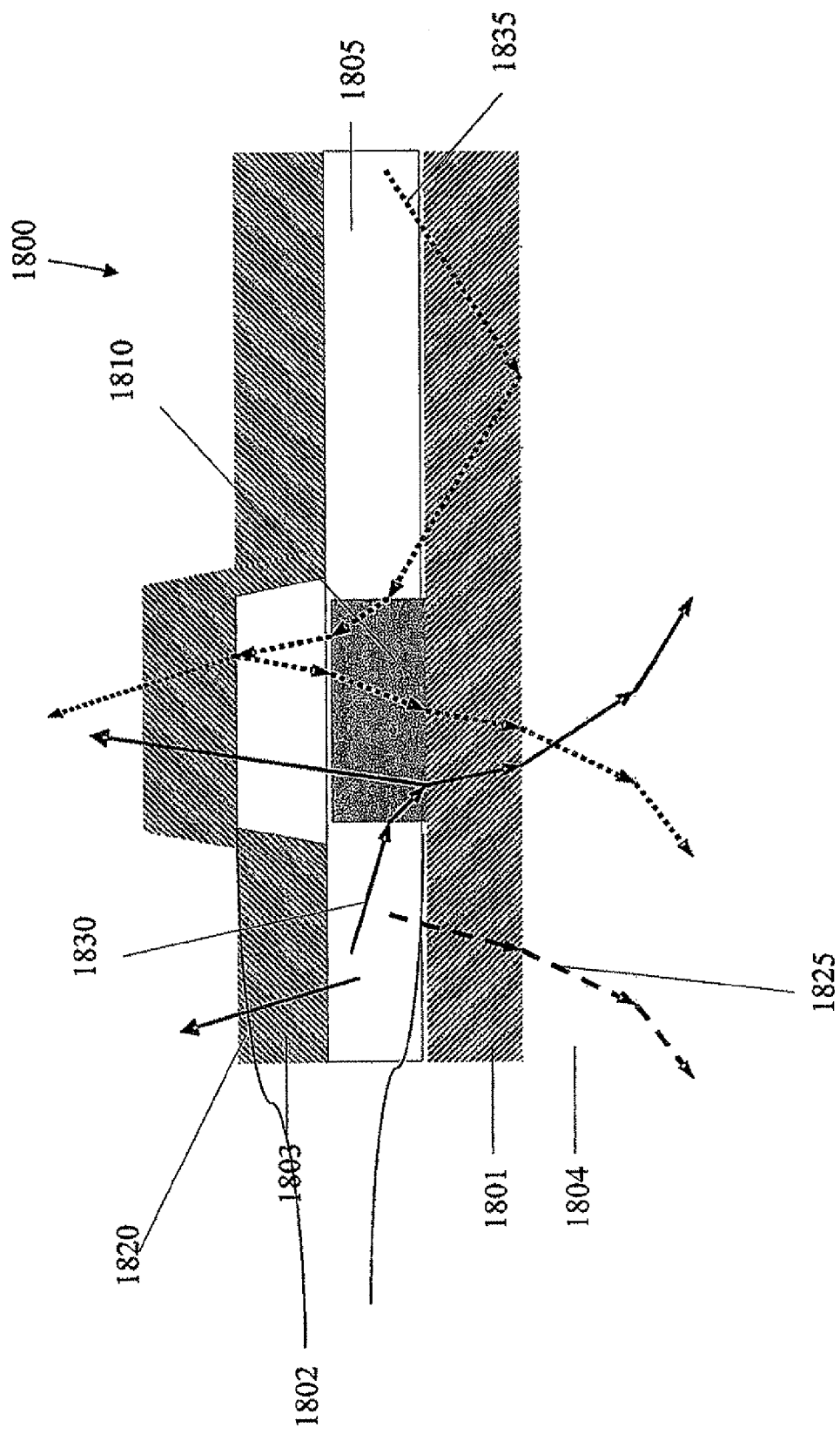
FIG. 18 shows a transparent or top emitting organic light emitting device having regions of a transparent material with a low refractive index.

FIG. 18 shows an exemplary device 1800 having low-index regions 1810. The device includes a substrate 1804, electrodes 1801 and 1803, and a layer 1802 that has regions of one or more emissive materials 1805 and regions of a low-index material 1810. It will be understood that the device shown in FIG. 18 may also include the various other layers and structures described herein.

The low-index material preferably contains a material that has a refractive index that is less than the refractive index of the emissive material, as this may increase the amount of waveguide mode light that is converted to air mode and/or glass mode. It may be preferred for the low-index material to have a refractive index of 1.0 to 3.0, and more preferably 1.0 to 1.50. Various low-index materials may be used for the low-index region, such as those described above.

FIGS. 19A-19C show an exemplary device with a low-index grid (LIG) embedded in the organic layer. The period of the grid (the spacing between the low-index regions) may be in the order of micrometers and greater than the wavelength of emitted light. It is believed that this periodicity allows a large proportion of light in a waveguide mode to enter the low index region, which redirects the light in a direction toward the substrate normal from which it escapes the device. It is also believed that because the periodicity of the LIG (about 5-20 µm) is an order of magnitude larger than the wavelength of the emitted light, the enhancement effect is independent of the wavelength. This may be useful for white-emitting TOLEDs, which may be characterized by a broad spectra, as there is substantially no distortion of the emission spectra of the extracted light. The periodicity of the LIG is also more than one magnitude smaller than a TOLED pixel (which is about 195 to 380 µm) and accordingly is believed not to affect the alignment between the pattern of the LIG and the TOLED pixels.

Moreover, it is believed that this embedding a LIG in a TOLED also eliminates effects of grating encountered in some devices, such as those reported in Cui et al., "Optimization of Light Extraction from OLEDs," Optics Express Vol. 15, No. 8 (Apr. 16, 2007).

By way of illustration, FIG. 18 shows exemplary rays 1820, 1825, 1830, and 1835 to indicate various possible outcomes when light is emitted by emissive material in the TOLED. The light 1830 produced in a waveguide mode would typically be unable to exit the emissive layer. In the ray-based optics example shown in FIG. 18, such light 1830 may be modeled as traveling within the emissive layer at a sufficiently large angle relative to the electrode normal that it will never be incident on the emissive layer interface. Similarly, waveguide mode light 1835 may be modeled as a ray that is incident on the emissive layer interface, but at a sufficiently high angle θ to undergo total internal reflection. Such light would normally not be emitted from either the top or bottom of the device 1800, but may be emitted from a side surface. However, low-index regions next to the emissive regions may allow light that would not normally be emitted by the device, or that would only be emitted from a side of the device, to exit through a viewing surface of the device. As shown in FIG. 18, light entering the low-index regions is refracted into a direction toward the substrate normal, allowing it to exit the device directly (1830) or after reflecting off an electrode (1835). That is, light passing through the low-index regions may be converted from waveguide mode to air mode, allowing it to be emitted from the device. In addition, the LIG does not affect light that directly exit by emitting from the top of the device (1820) or from the bottom (1825) for transparent devices.

Low-index material 1810 may be deposited on an electrode 1801. The low-index material may be deposited in the various patterns, grids, and other structures as described herein. One or more organic materials 1805 may then be deposited over the electrode 1803 and the low-index regions 1810, resulting in an organic layer with an uneven surface. An electrode 1803 or other layer may be deposited on the organic layer 1805, such that the resulting surface is also uneven, or the electrode 1803 or other layer may be deposited so as to create a smooth surface.

Although FIG. 18 shows the boundaries between low-index regions 1810 and adjacent organic regions 1805 as being flat interfaces perpendicular to the electrodes and substrate, this may not always be the case as illustrated, for example, in FIGS. 3B and 3C.

FIGS. 19A-19C show exemplary TOILED device 1900 having an LIG 1910 embedded in the organic layer. The device includes a glass substrate 1901, ITO electrode 1902, cathode 1904, and a layer 1903 that has regions of one or more organic layers 1905 and LIG 1910. FIG. 19B shows device 1900 having an LIG 1910 arranged in a rectangular grid oriented in a plane parallel to electrodes 1902 and 1904. FIG. 19A show the top view of device 1900. FIG. 19C shows a tilted view and a cross section (side view) of such a device. Organic layer 1905 can include emissive material, charge transport and/or blocking materials, and the other structures and layers described herein. Although it may be preferred for each repeated portion of LIG 1910 to have approximately the same dimensions, portions of the grid may have varying dimensions. For example, a regular rectangular grid has emissive regions that are square when viewed from above. Other grid types, such as triangular or octagonal, also may be used, as well as various other patterns and structures.

Figure 20A:
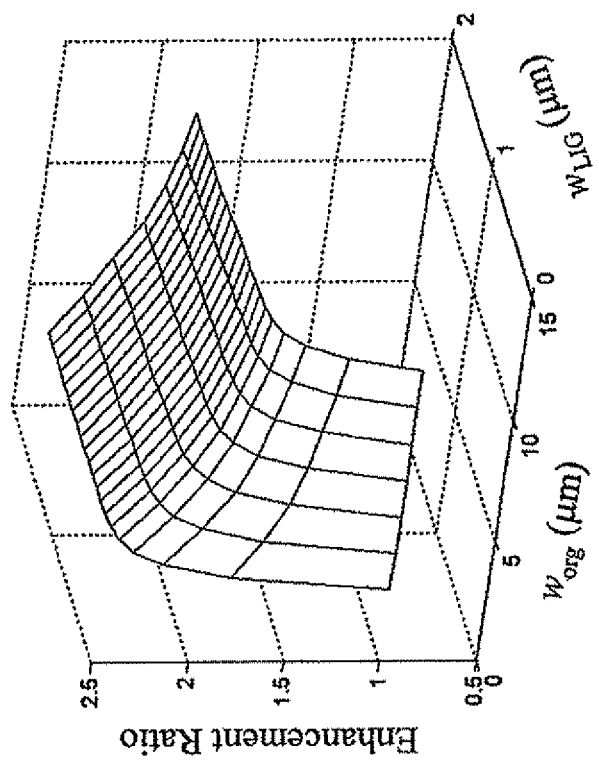
Figure 20B:
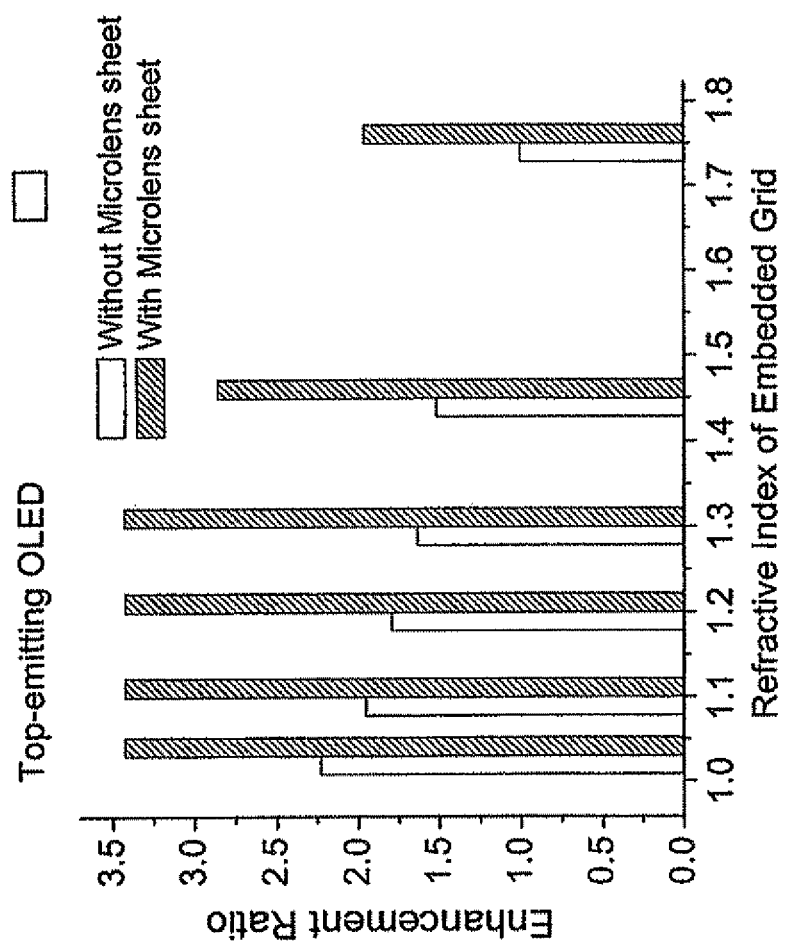

FIGS. 20A-20C shows simulated emission for a device having a rectangular grid of a low-index material having a refractive index of 1.03. The thickness of the low-index regions is 100 nm, the organic layers is 100 nm, and a bottom ITO electrode 120 nm. FIG. 20C shows that enhancement is optimized when the thickness of the LIG is the same as the thickness of the organic layers. The enhancement ratio may decrease as the thickness of the LIG decreases.

FIG. 20A shows that the enhancement ratio increases as the width of the organic region ($w_{org}$) decreases since more light in waveguide mode is outcoupled by entering the LIG prior to absorption in the organic and ITO layers. FIG. 20A also shows that the enhancement ratio increases as the width of the LIG increases ($w_{LIG}$) since more light may be extracted out of waveguide mode without re-entering the organic layers.

For practical reasons, the width of the organic layer in such simulated emissions cannot be too small to ensure that the effective emitting area is sufficient for the device to achieve the required brightness. In FIGS. 20A-20C, the width of the LIG is 1 µm and the organic layers is 6 µm, giving an effective lighting area of over 70%. FIG. 20B shows that the outcoupling efficiency of a top-emitting OLED increases with decreasing index of the LIG. As the refractive index of the LIG increases, more light is converted to glass mode and less is converted to air mode.

FIG. 21 shows an exemplary device having a microlens sheet 610 *e* disposed adjacent to the substrate, or the substrate may include a microlens or microlens sheet. FIG. 20B shows the simulated enhancement of light as a function of the index of refraction for a top emitting OLED with an LIG (open bars) and with an LIG and a microlens (shaded bars). The outcoupling efficiency for such devices may be enhanced by a factor of about 2-3.

Figure 14:
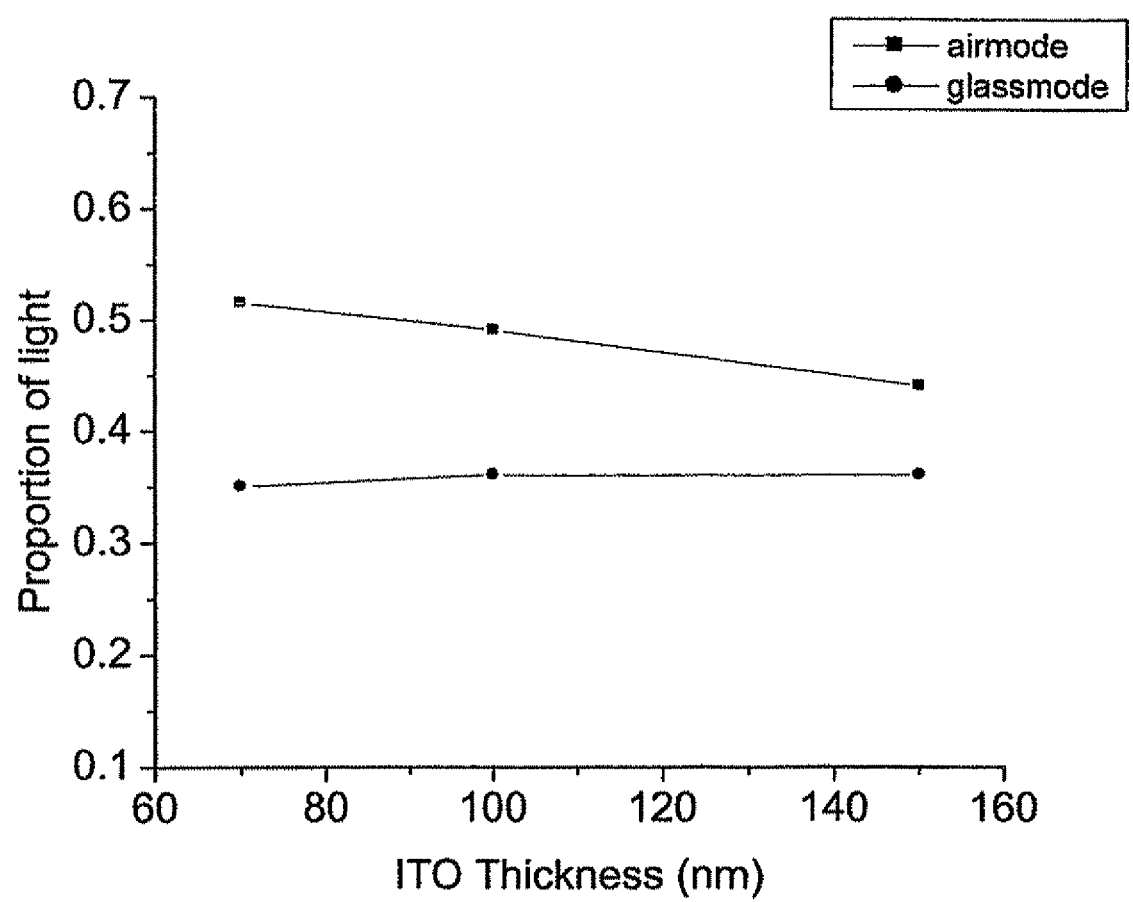
FIG. 14 shows the proportion of light in air mode and glass mode in devices with various electrode thicknesses.
Figure 15:
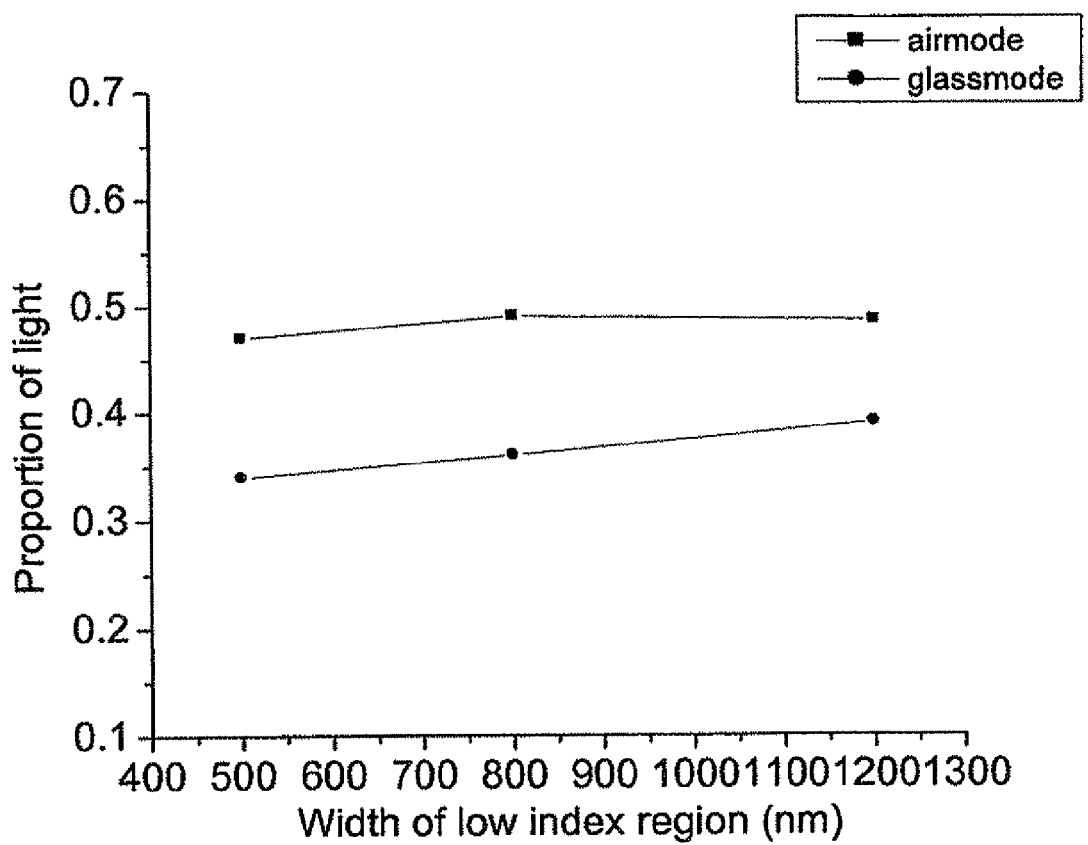
FIG. 15 shows the proportion of light in various modes for device having low-index regions of varying width.
Figure 16:
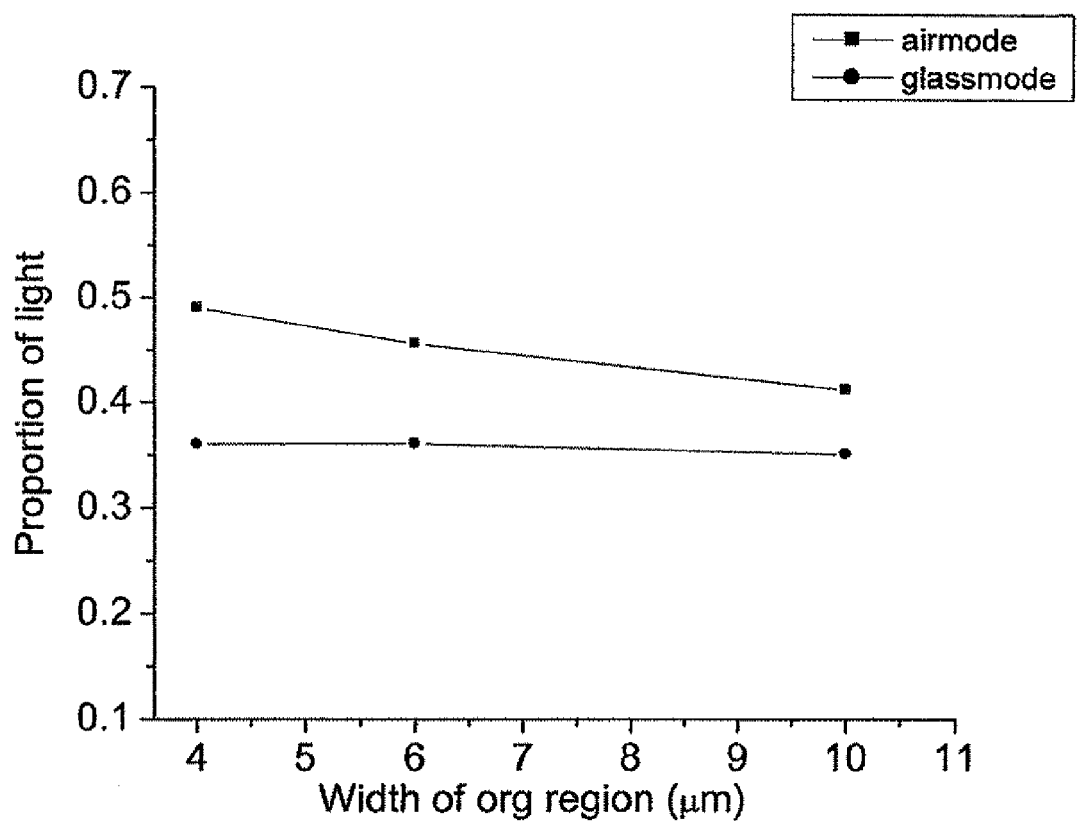
FIG. 16 shows the proportion of light in various modes for a device having organic regions from 4 μm to 10 μm.
Figure 17:
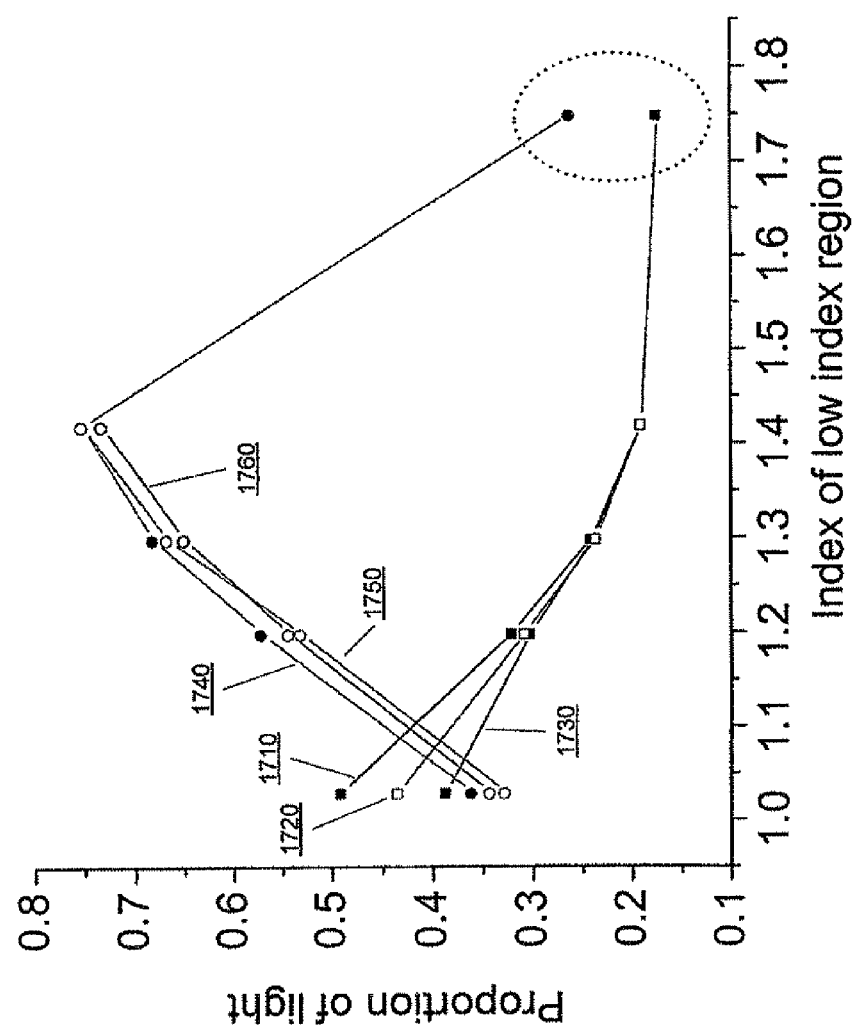
FIG. 17 shows the proportion of light in various modes for a device having low-index regions with varying refractive indices and geometries.

The amount of light ultimately converted to air mode and emitted from the device can be further affected by changing other structural features of the device, such as the electrode thickness, the width of the low-index regions, and/or the width of the emissive regions. FIGS. 14-17 show simulated results for variations in various device parameters. Unless indicated otherwise, each device was modeled with low-index regions 0.8 µm wide in a 1D periodic grid, organic emissive regions 4 µm wide, a 100 nm thick ITO electrode, and a low-index material refractive index of 1.03. FIG. 14 shows the proportion of light in air mode (squares) and glass mode (circles) as a function of ITO thickness, for thicknesses ranging from 70 to 150 nm. FIG. 15 shows the proportion of light in each mode for low-index regions of varying width, from 500 to 1200 nm. FIG. 16 shows the proportion of light in each mode for organic regions from 4 µm to 10 µm. FIG. 17 shows the proportion of light in each mode for low-index material refractive indices of 1 to 1.75, for square and hexagonal grids. Values are shown for air mode for an ideal 1D periodic grid 1710, a square grid 1720, and a hexagonal grid 1730, and for glass mode for an ideal 1D periodic grid 1740, a square grid 1750, and a hexagonal grid 1760. The values indicated by the dotted oval are the same as those for a conventional OLED. For the structures shown in FIGS. 14-17, a conventional OLED typically demonstrates proportions of about 0.17 light in air mode and 0.26 in glass mode.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge transfer are not intended to be limiting.

Material Definitions:

As used herein, abbreviations refer to materials as follows:
CBP: 4,4'-N,N-dicarbazole-biphenyl
m-MTDATA 4,4',4"-tris(3-methylphenylphenlyamino)triphenylamine
$Alq_3$: 8-tris-hydroxyquinoline aluminum
Bphen: 4,7-diphenyl-1,10-phenanthroline
$F_4$-TCNQ: tetrafluoro-tetracyano-quinodimethane
$Ir(ppy)_3$: tris(2-phenylpyridine)-iridium
BCP: 2,9-dimethyl-4,7-diphenyl-1,10-phenanthroline
CuPc: copper phthalocyanine.
ITO: indium tin oxide
NPD: N,N'-diphenyl-N—N'-di(1-naphthyl)-benzidine
TPD: N,N'-diphenyl-N—N'-di(3-toly)-benzidine
mCP: 1,3-N,N-dicarbazole-benzene
DCM: 4-(dicyanoethylene)-6-(4-dimethylaminostyryl-2-methyl)-4H-pyran
DMQA: N,N'-dimethylquinacridone
PEDOT:PSS: an aqueous dispersion of poly(3,4-ethylenedioxythiophene) with polystyrenesulfonate (PSS)

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. An organic light-emitting device comprising:
a substrate;
a first electrode disposed over the substrate;
an organic layer disposed over the first electrode, the organic layer comprising:
   a first region comprising an organic emissive material; and
   a second region comprising a transparent low-index material embedded within the organic layer in the form of a grid oriented in a plane parallel to the first electrode, wherein the grid has a periodic pattern with a periodicity of 5-20 µm, wherein the low-index material has a refractive index less than the refractive index of the organic emissive material; and
a second electrode disposed over the organic layer;
wherein at least one of the first and second electrodes is a transparent electrode;
wherein the device emits white light;
wherein the thickness of the transparent low-index material extends from a surface of the first electrode to a surface of the second electrode; and,
wherein the low-index material has a refractive index less than the refractive index of the substrate.

2. The device of claim 1, wherein the device is a top-transmitting OLED.

3. The device of claim 1, wherein the low-index material has a refractive index of 1.0 to 1.3.

4. The device of claim 3, wherein the refractive index of the low-index material is 0.15 to 0.4 less than the refractive index of the substrate.

5. The device of claim 1, wherein the grid is oriented in a plane parallel to both the first electrode and to the second electrode.

6. The device of claim 1, further comprising a microlens sheet disposed below the substrate, such that a convex side of the microlens sheet faces in the direction opposite the substrate.

7. The device of claim 1, wherein the low-index material is selected from the group consisting of aerogel, polytetrafluoroethylene, a graded film of $SiO_2$, a graded film of $TiO_2$, and layers of $SiO_2$ nanorods.

8. The device of claim 1, wherein the refractive index of the low-index material is 0.15 to 0.4 less than the refractive index of the substrate.

9. The device of claim 1, wherein the low-index material is selected from the group consisting of aerogel, polytetrafluoroethylene, a graded film of $SiO_2$, and layers of $SiO_2$ nanorods.

10. The device of claim 1, wherein the low-index material is selected from the group consisting of polytetrafluoroethylene, a graded film of $SiO_2$, and layers of $SiO_2$ nanorods.

11. A method of manufacturing a light-emitting device, comprising:
depositing a first electrode over a substrate;
depositing a grid of a low-index material over the first electrode with a periodicity of 5-20 µm, the low-index material having a refractive index of 1.0 to 1.3;
depositing an organic emissive material over the grid such that the organic emissive material is in direct contact with the grid or with the first electrode; and
depositing a second electrode over the organic emissive material;
wherein at least one of the first and second electrodes is a transparent electrode; and wherein the grid of the low-index material redirects light emitted by the organic emissive material from a waveguide node to a direction that may escape the device through the transparent electrode;
wherein the device emits white light;
wherein the thickness of the low-index material extends from a surface of the first electrode to a surface of the second electrode; and,
wherein the refractive index of the low-index material is less than the refractive index of the substrate.

12. The method of claim 11, wherein the refractive index of the low-index material is 0.15 to 0.4 less than the refractive index of the substrate.

* * * * *